United States Patent
Cho et al.

(10) Patent No.: US 10,878,215 B2
(45) Date of Patent: Dec. 29, 2020

(54) ELECTRONIC DEVICE HAVING A BIOMETRIC SENSOR

(71) Applicant: SAMSUNG ELECTRONICS CO., LTD., Suwon-si (KR)

(72) Inventors: Joungmin Cho, Seoul (KR); Minsuk Uhm, Hwaseong-si (KR); Gyusang Cho, Seongnam-si (KR); Taesung Kim, Suwon-si (KR); Hyunchang Shin, Seongnam-si (KR); Heungsik Shin, Yongin-si (KR); Jiwoong Oh, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/876,550

(22) Filed: Jan. 22, 2018

(65) Prior Publication Data

US 2018/0211088 A1 Jul. 26, 2018

(30) Foreign Application Priority Data

Jan. 26, 2017 (KR) ........................ 10-2017-0012979

(51) Int. Cl.
*H01L 29/78* (2006.01)
*H01L 27/32* (2006.01)
(Continued)

(52) U.S. Cl.
CPC ............. *G06K 9/0004* (2013.01); *G06K 9/22* (2013.01); *G09G 3/3233* (2013.01); *G09G 5/00* (2013.01);
(Continued)

(58) Field of Classification Search
CPC .......... H01L 29/78633; H01L 27/3227; H01L 27/3262; H01L 27/3265; H01L 27/3272; G06K 9/0004
See application file for complete search history.

(56) References Cited

U.S. PATENT DOCUMENTS 6,242,769 B1 * 6/2001 Chang ............... H01L 27/14678
257/291
6,688,186 B2 * 2/2004 Chae .................... G06K 9/0004
257/E27.111

(Continued)

FOREIGN PATENT DOCUMENTS

KR  2003-0058719  7/2003
KR  10-0775394   11/2007
(Continued)

*Primary Examiner* — Ida M Soward
(74) *Attorney, Agent, or Firm* — Nixon & Vanderhye P.C.

(57) ABSTRACT

Certain example embodiments relate to an installation structure of a biometric sensor synchronized with a display and a control method thereof. The electronic device may include: a light emitting circuitry configured to output light including a predetermined frequency band; a display panel configured to display an image by using one or more pixels, wherein the one or more pixels includes a plurality of sub-pixels; at least one driver circuit configured to drive at least one pixel among the plurality of sub-pixels; and an optical shielding layer formed adjacent to the at least one driver circuit in order to protect the at least one driver circuit from the light including a predetermined frequency band. Various embodiments can be implemented.

16 Claims, 20 Drawing Sheets

(51) Int. Cl.
*G06K 9/00* (2006.01)
*G06K 9/22* (2006.01)
*G09G 3/3233* (2016.01)
*G09G 5/00* (2006.01)
*G09G 3/3208* (2016.01)
*H01L 29/786* (2006.01)

(52) U.S. Cl.
CPC ...... *H01L 27/3227* (2013.01); *H01L 27/3234* (2013.01); *H01L 27/3262* (2013.01); *H01L 27/3265* (2013.01); *H01L 27/3272* (2013.01); *G09G 3/3208* (2013.01); *G09G 2300/0426* (2013.01); *G09G 2300/0852* (2013.01); *G09G 2300/0866* (2013.01); *G09G 2354/00* (2013.01); *H01L 29/78633* (2013.01)

(56) References Cited

U.S. PATENT DOCUMENTS

| | | | | |
|---|---|---|---|---|
| 6,768,535 | B2* | 7/2004 | Yasukawa | G02F 1/136209 349/111 |
| 6,770,908 | B2* | 8/2004 | Sato | G02F 1/136209 257/294 |
| 6,784,413 | B2* | 8/2004 | Sasaki | G06K 9/0002 250/214 R |
| 6,952,022 | B2* | 10/2005 | Jang | H01L 27/14643 257/294 |
| 6,953,949 | B2* | 10/2005 | Murade | G02F 1/136209 257/294 |
| 7,242,449 | B1* | 7/2007 | Yamazaki | G02F 1/1362 349/116 |
| 7,719,185 | B2* | 5/2010 | Jin | H01L 27/3244 313/506 |
| 8,059,220 | B2* | 11/2011 | Oyamada | G02F 1/136213 349/39 |
| 8,155,305 | B2* | 4/2012 | Yamazaki | H04M 1/7258 379/433.07 |
| 8,169,558 | B2* | 5/2012 | Morimoto | G02F 1/134363 349/139 |
| 8,575,713 | B2* | 11/2013 | Makita | H01L 27/1214 257/458 |
| 8,896,775 | B2* | 11/2014 | Moriwaki | G02F 1/136209 349/38 |
| 9,219,156 | B2* | 12/2015 | Hwang | H01L 29/786 |
| 9,664,973 | B2* | 5/2017 | Yan | G02F 1/1368 |
| 9,690,153 | B2* | 6/2017 | Iki | H01L 29/78633 |
| 9,759,941 | B2* | 9/2017 | Yang | H01L 27/12 |
| 9,836,165 | B2* | 12/2017 | Nho | G06F 3/0421 |
| 9,864,447 | B2* | 1/2018 | Cho | G06F 3/0412 |
| 9,892,303 | B2* | 2/2018 | Li | G06K 9/0004 |
| 9,911,762 | B2* | 3/2018 | Yan | G02F 1/133345 |
| 9,971,181 | B2* | 5/2018 | Cho | G02F 1/13338 |
| 10,084,013 | B2* | 9/2018 | Huang | H01L 29/786 |
| 10,211,265 | B2* | 2/2019 | Jeon | H01L 27/3272 |
| 2002/0047120 | A1* | 4/2002 | Inukai | G09G 3/2022 257/59 |
| 2003/0228723 | A1* | 12/2003 | Yamazaki | H01L 21/2026 438/164 |
| 2006/0290829 | A1* | 12/2006 | Kim | G02F 1/136209 349/44 |
| 2007/0069995 | A1* | 3/2007 | Shin | H01L 27/3232 345/76 |
| 2008/0087889 | A1* | 4/2008 | Chan | H01L 27/1229 257/40 |
| 2008/0121442 | A1 | 5/2008 | Boer et al. | |
| 2011/0096009 | A1* | 4/2011 | Kurokawa | G06F 3/042 345/173 |
| 2012/0050654 | A1* | 3/2012 | Kim | G06F 3/0412 349/116 |
| 2012/0058631 | A1* | 3/2012 | Ikeda | H01L 27/12 438/486 |
| 2012/0200546 | A1* | 8/2012 | Miyamoto | H01L 27/14623 345/205 |
| 2013/0020573 | A1* | 1/2013 | Fukuyama | G01L 1/146 257/53 |
| 2014/0278229 | A1* | 9/2014 | Hong | A63B 71/06 702/160 |
| 2015/0243712 | A1* | 8/2015 | Wang | H01L 27/3227 257/40 |
| 2015/0371579 | A1* | 12/2015 | Yu | G09G 3/32 345/690 |
| 2016/0172426 | A1 | 6/2016 | Kim et al. | |
| 2016/0189675 | A1* | 6/2016 | Im | G09G 5/026 345/592 |
| 2016/0254338 | A1* | 9/2016 | Lin | H01L 27/3272 257/40 |
| 2016/0266695 | A1* | 9/2016 | Bae | G06K 9/00053 |
| 2017/0081588 | A1* | 3/2017 | Huh | C09K 19/3003 |
| 2017/0090182 | A1* | 3/2017 | Steyn | H01L 27/1259 |
| 2017/0090236 | A1* | 3/2017 | Yeh | G02F 1/13458 |
| 2017/0212397 | A1* | 7/2017 | Cao | G02F 1/136213 |
| 2017/0301705 | A1* | 10/2017 | Hu | H01L 51/52 |
| 2017/0338252 | A1* | 11/2017 | Lee | H01L 27/1255 |
| 2017/0364188 | A1 | 12/2017 | Bae et al. | |
| 2018/0047764 | A1* | 2/2018 | Deng | H01L 21/77 |
| 2018/0143476 | A1* | 5/2018 | Utsunomiya | G06F 3/0412 |
| 2018/0199814 | A1* | 7/2018 | Stump | G16H 50/30 |
| 2019/0318698 | A1* | 10/2019 | Yamazaki | G09G 3/3413 |

FOREIGN PATENT DOCUMENTS

| | | | | |
|---|---|---|---|---|
| KR | 20090077280 A | * | 7/2009 | ........... C08K 5/3417 |
| KR | 10-2016-0029698 | | 3/2016 | |

\* cited by examiner

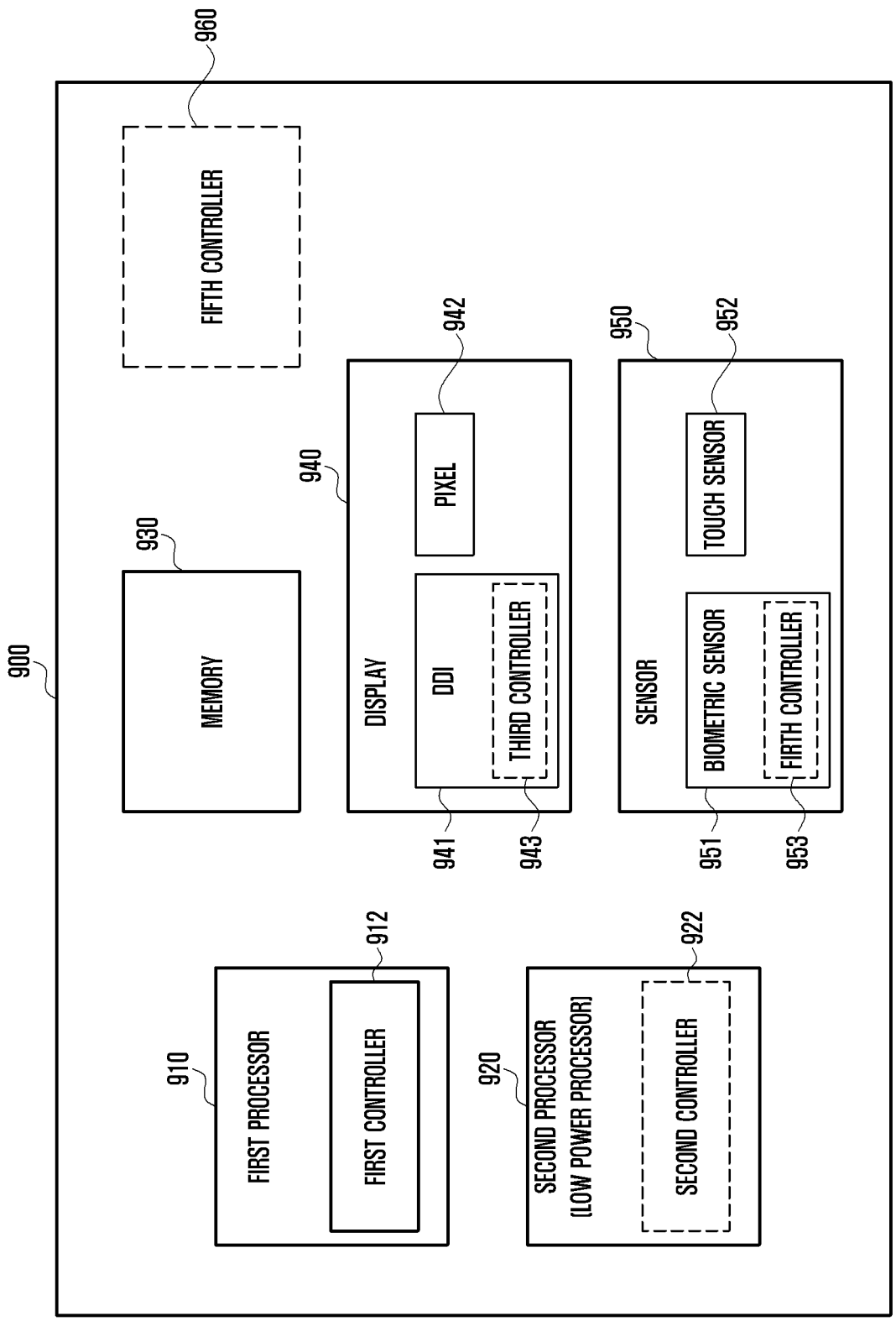

ELECTRONIC DEVICE HAVING A BIOMETRIC SENSOR

CROSS-REFERENCE TO RELATED APPLICATION

This application is based on and claims priority under 35 U.S.C. § 119 to a Korean patent application filed on Jan. 26, 2017, in the Korean Intellectual Property Office and assigned Serial No. 10-2017-0012979, the entire disclosure of which is hereby incorporated by reference herein in its entirety.

FIELD

Example embodiments relate to an installation structure of a biometric sensor synchronized with a display and/or a control method thereof.

BACKGROUND

A biometric sensor is used as one of various security devices for electronic devices, and a separate biometric sensor is launched at an installation location or integrated into a button in order to optimize user convenience.

SUMMARY

Recently, a biometric sensor (e.g., fingerprint sensor) is used as one of various security devices for electronic devices. The biometric sensor can be installed separately from a display and/or integrated into a button of the electronic device.

Further, the electronic devices can provide an authentication function based on biometric information obtained from the biometric sensor. However, if the biometric information is not at a level (e.g., accuracy) for providing the authentication function or if an error is generated in the biometric sensor obtaining the biometric information, a user may face difficulties in using the authentication function.

Various example embodiments of the present disclosure may provide an electronic device having an improved usability by using a display synchronized with a biometric sensor.

An electronic device according to various example embodiments of the present disclosure may comprise: a light emitting circuitry configured to output light including a predetermined frequency band; a display panel configured to display an image by using one or more pixels, wherein the one or more pixels includes a plurality of sub-pixels; at least one driver circuit configured to drive at least one pixel among the plurality of sub-pixels; and an optical shielding layer formed adjacent to the at least one driver circuit in order to protect the at least one driver circuit from the light including a predetermined frequency band.

BRIEF DESCRIPTION OF THE DRAWINGS

The above and other aspects, features, and advantages of certain embodiment of the present invention will be more apparent from the following description taken in conjunction with the accompanying drawings, in which:

FIG. 9 is a block diagram illustrating another example of an electronic device according to various example embodiments of the present disclosure;

DETAILED DESCRIPTION

Figure 1:
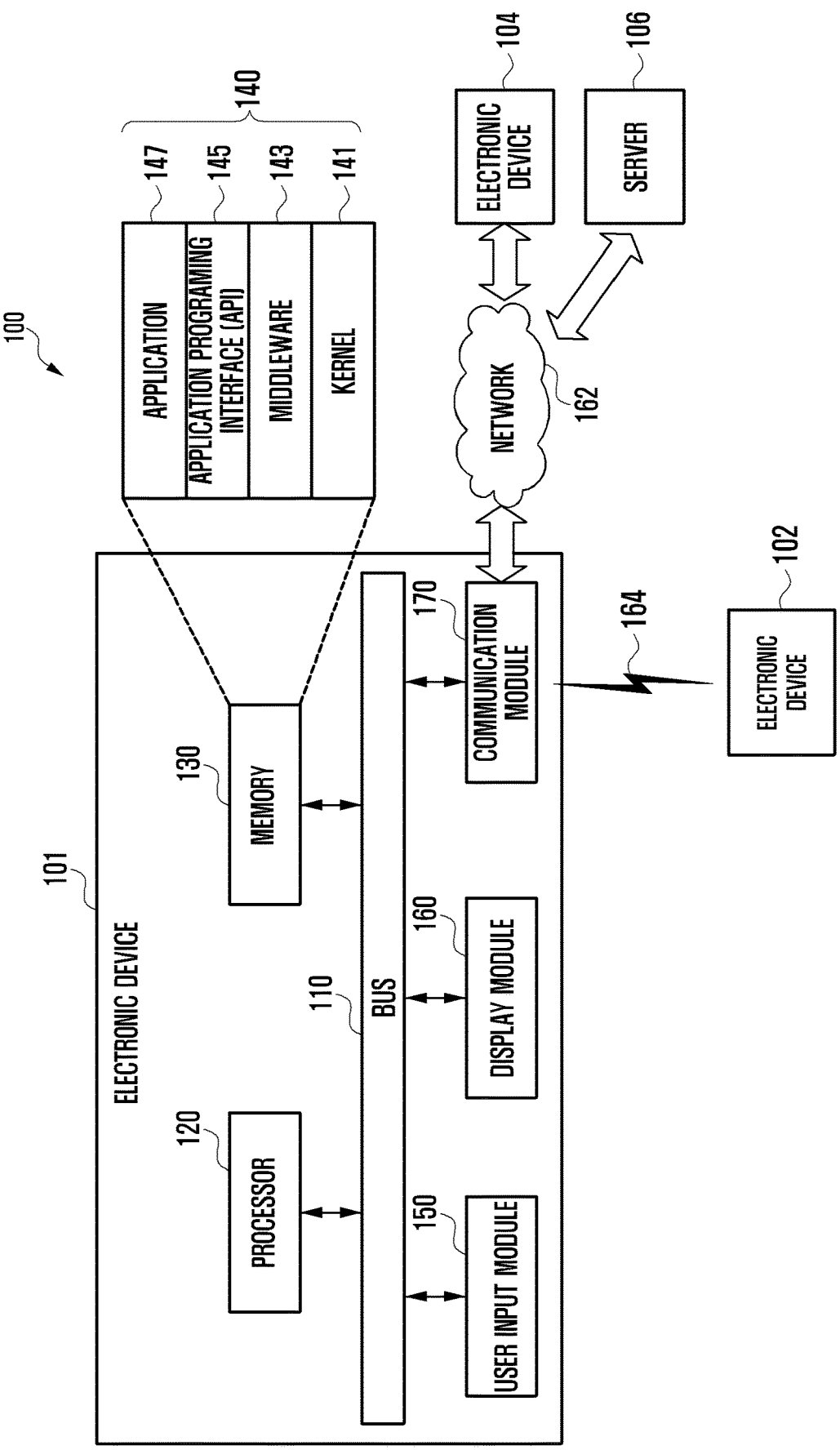
FIG. 1 is a block diagram illustrating an electronic device in a network environment according to various example embodiments of the present disclosure.

The following description with reference to the accompanying drawings is provided to aid in a comprehensive understanding of various example embodiments of the present disclosure as defined by the claims and their equivalents, in which like reference numerals refer to like parts throughout the several views. It includes various details to aid in that understanding but these are to be regarded as merely examples. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

The expressions such as "include" and "may include" may denote the presence of the disclosed functions, operations, and constituent elements and do not limit one or more additional functions, operations, and constituent elements. Terms such as "include" and/or "have" may be construed to denote a certain characteristic, number, operation, constituent element, component or a combination thereof, but may not be construed to exclude the existence of or a possibility of addition of one or more other characteristics, numbers, operations, constituent elements, components or combinations thereof.

Furthermore, in the present disclosure, the expression "and/or" includes any and all combinations of the associated listed words. For example, the expression "A and/or B" may include A, may include B, or may include both A and B.

In the present disclosure, expressions including ordinal numbers, such as "first" and "second," etc., may modify various elements. However, such elements are not limited by the above expressions. For example, the above expressions do not limit the sequence and/or importance of the elements. The above expressions are used merely for the purpose to distinguish an element from the other elements. For example, a first user device and a second user device indicate different user devices although both of them are user devices. For example, a first element could be termed a second element, and similarly, a second element could be also termed a first element without departing from the scope of the present disclosure.

In the case where a component is referred to as being "connected" or "accessed" to other component, it should be understood that not only the component is directly connected or accessed to the other component, but also there may exist another component(s) between them. Meanwhile, in the case where a component is referred to as being "directly connected" or "directly accessed" to other component, it should be understood that there is no component therebetween. The terms used in the present disclosure are only used to describe specific various embodiments, and are not intended to limit the present disclosure. As used herein, the singular forms are intended to include the plural forms as well, unless the context clearly indicates otherwise. Singular forms are intended to include plural forms unless the context clearly indicates otherwise.

An electronic device according to the present disclosure may be a device including a communication function. For example, the device corresponds to a combination of at least one of a smartphone, a tablet Personal Computer (PC), a mobile phone, a video phone, an e-book reader, a desktop PC, a laptop PC, a netbook computer, a Personal Digital Assistant (PDA), a Portable Multimedia Player (PMP), a digital audio player, a mobile medical device, an electronic bracelet, an electronic necklace, an electronic accessory, a camera, a wearable device, an electronic clock, a wrist watch, home appliances (for example, an air-conditioner, vacuum, an oven, a microwave, a washing machine, an air cleaner, and the like), an artificial intelligence robot, a TeleVision (TV), a Digital Video Disk (DVD) player, an audio device, various medical devices (for example, Magnetic Resonance Angiography (MRA), Magnetic Resonance Imaging (MRI), Computed Tomography (CT), a scanning machine, a ultrasonic wave device, or the like), a navigation device, a Global Positioning System (GPS) receiver, an Event Data Recorder (EDR), a Flight Data Recorder (FDR), a set-top box, a TV box (for example, Samsung HomeSync™, Apple TV™, or Google TV™), an electronic dictionary, vehicle infotainment device, an electronic equipment for a ship (for example, navigation equipment for a ship, gyrocompass, or the like), avionics, a security device, electronic clothes, an electronic key, a camcorder, game consoles, a Head-Mounted Display (HMD), a flat panel display device, an electronic frame, an electronic album, furniture or a portion of a building/structure that includes a communication function, an electronic board, an electronic signature receiving device, a projector, and the like. It will be apparent to those skilled in the art that the electronic device according to the present disclosure is not limited to the aforementioned devices.

FIG. 1 is a block diagram illustrating an example configuration of an electronic device according to an example embodiment of the present disclosure.

Referring to FIG. 1, the electronic device 101 is illustrated in a network environment 100, and may include a bus 110, a processor 120 (including processing circuitry), a memory 130, an input/output interface (e.g., including input/output circuitry) 150, a display 160, a communication interface (e.g., including communication circuitry) 160, and other similar and/or suitable components.

The bus 110 may be a circuit which interconnects the above-described elements and delivers a communication (e.g., a control message) between the above-described elements.

The processor 120 may receive commands from the above-described other elements (e.g., the memory 130, the input/output interface 150, the display 160, the communication interface 170, etc.) through the bus 110, may interpret the received commands, and may execute calculation or data processing according to the interpreted commands.

The memory 130 may store commands or data received from the processor 120 or other elements (e.g., the input/output interface 150, the display 160, the communication interface 170, etc.) or generated by the processor 120 or the other elements. The memory 130 may include programming modules, such as a kernel 141, middleware 143, an Application Programming Interface (API) 145, an application 147, and/or the like. Each of the above-described programming modules may be implemented in software, firmware, hardware, or a combination of two or more thereof.

The kernel 141 may control or manage system resources (e.g., the bus 110, the processor 120, the memory 130, etc.) used to execute operations or functions implemented by other programming modules (e.g., the middleware 143, the API 145, and the application 147). Also, the kernel 141 may provide an interface capable of accessing and controlling or managing the individual elements of the electronic device 101 using the middleware 143, the API 145, and/or the application 147.

The middleware 143 may serve to go between the API 145 or the application 147 and the kernel 141 in such a manner that the API 145 or the application 147 communicates with the kernel 141 and exchanges data therewith. Also, in relation to work requests received from one or more applications 147 and/or the middleware 145, for example, may perform load balancing of the work requests using a method of assigning a priority, in which system resources (e.g., the bus 110, the processor 120, the memory 130, etc.) of the electronic device 101 can be used, to at least one of the one or more applications 147.

The API 145 is an interface through which the application 147 is capable of controlling a function provided by the kernel 141 or the middleware 143, and may include, for example, at least one interface or function for file control, window control, image processing, character control, or the like.

The input/output interface 150 may include various input/output circuitry configured to, for example, receive a command or data as input from a user, and may deliver the received command or data to the processor 120 or the memory 130 through the bus 110. The display 160 may display a video, an image, data, or the like to the user.

The communication interface 170 may include various communication circuitry configured to connect communication between another electronic device 102 and the electronic device 101. The communication interface 170 may support a predetermined short-range communication protocol (e.g., Wi-Fi, BlueTooth (BT), and Near Field Communication (NFC)), or predetermined network communication 162 (e.g., the Internet, a Local Area Network (LAN), a Wide Area Network (WAN), a telecommunication network, a cellular network, a satellite network, a Plain Old Telephone Service (POTS), or the like). Each of the electronic devices 102 and 104 may be a device which is identical (e.g., of an identical type) to or different (e.g., of a different type) from the electronic device 101. Further, the communication module 170 may connect communication between a server 106 and the electronic device 101 via the network 162, and wireless communication 164 may be used between electronic device 101 and electronic device 102.

Figure 2:
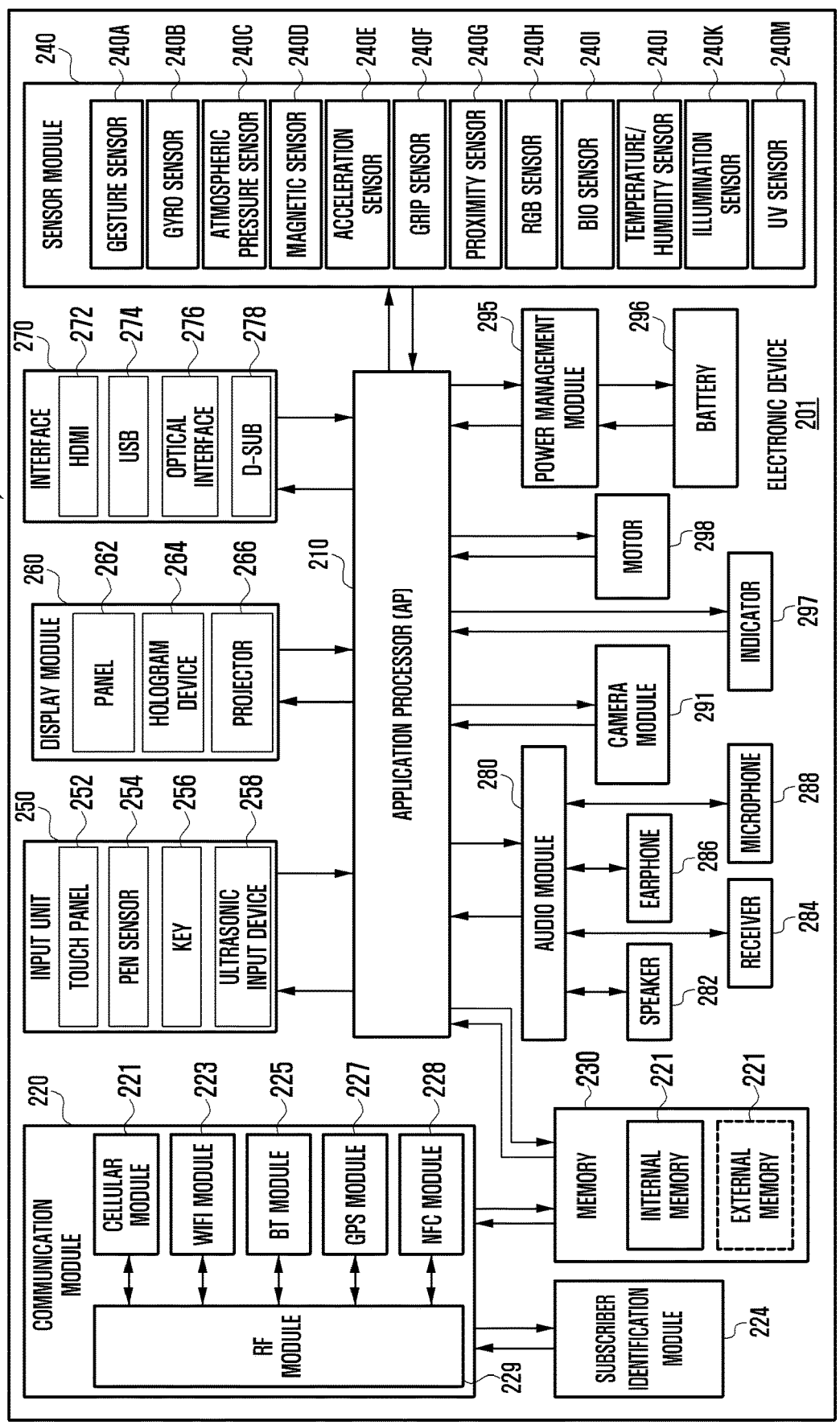
FIG. 2 is a block diagram illustrating a configuration of an electronic device according to various example embodiments of the present disclosure.

FIG. 2 is a block diagram 200 illustrating an example configuration of an electronic device 201/101 according to an example embodiment of the present disclosure.

The hardware 200 in FIG. 2 may be, for example, the electronic device 101 illustrated in FIG. 1.

Referring to FIG. 2, the electronic device may include one or more processors 210 (including processing circuitry), a communication module (e.g., including communication circuitry) 220, a Subscriber Identification Module (SIM) card 224, a memory 230, a sensor module 240, a input device (e.g., including input circuitry) 250, a display module 260, an interface (e.g., including interface circuitry) 270, an audio module 280, a camera module 291, a power management module 295, a battery 296, an indicator 297, a motor 298 and any other similar and/or suitable components, each of which includes circuitry for performing the respective functions.

The Application Processor (AP) 210 (e.g., the processor 120, which may include processing circuitry) may include one or more Application Processors (APs), or one or more Communication Processors (CPs). The processor 210 may be, for example, the processor 120 illustrated in FIG. 1. The AP 210 is illustrated as being included in the processor 210 in FIG. 2, but may be included in different Integrated Circuit (IC) packages, respectively. According to an embodiment of the present disclosure, the AP 210 may be included in one IC package.

The AP 210 may execute an Operating System (OS) or an application program, and thereby may control multiple hardware or software elements connected to the AP 210 and may perform processing of and arithmetic operations on various data including multimedia data. The AP 210 may be implemented by, for example, a System on Chip (SoC). According to an embodiment of the present disclosure, the AP 210 may further include a Graphical Processing Unit (GPU) (not illustrated).

The AP 210 may manage a data line and may convert a communication protocol in the case of communication between the electronic device (e.g., the electronic device 100) including the hardware 200 and different electronic devices connected to the electronic device through the network. The AP 210 may be implemented by, for example, a SoC. According to an embodiment of the present disclosure, the AP 210 may perform at least some of multimedia control functions. The AP 210, for example, may distinguish and authenticate a terminal in a communication network by using a subscriber identification module (e.g., the SIM card 224). Also, the AP 210 may provide the user with services, such as a voice telephony call, a video telephony call, a text message, packet data, and the like.

Further, the AP 210 may control the transmission and reception of data by the communication module 220. In FIG. 2, the elements such as the AP 220, the power management module 295, the memory 230, and the like are illustrated as elements separate from the AP 210. However, according to an embodiment of the present disclosure, the AP 210 may include at least some (e.g., the CP) of the above-described elements.

According to an example embodiment of the present disclosure, the AP 210 may load, to a volatile memory, a command or data received from at least one of a non-volatile memory and other elements connected to each of the AP 210, and may process the loaded command or data. Also, the AP 210 may store, in a non-volatile memory, data received from or generated by at least one of the other elements.

The SIM card 224 may be a card implementing a subscriber identification module, and may be inserted into a slot formed in a particular portion of the electronic device 100. The SIM card 224 may include unique identification information (e.g., Integrated Circuit Card IDentifier (ICCID)) or subscriber information (e.g., International Mobile Subscriber Identity (IMSI)).

The memory 230 may include an internal memory 232 and an external memory 234. The memory 230 may be, for example, the memory 130 illustrated in FIG. 1. The internal memory 232 may include, for example, at least one of a volatile memory (e.g., a Dynamic RAM (DRAM), a Static RAM (SRAM), a Synchronous Dynamic RAM (SDRAM), etc.), and a non-volatile memory (e.g., a One Time Programmable ROM (OTPROM), a Programmable ROM (PROM), an Erasable and Programmable ROM (EPROM), an Electrically Erasable and Programmable ROM (EEPROM), a mask ROM, a flash ROM, a Not AND (NAND) flash memory, a Not OR (NOR) flash memory, etc.). According to an embodiment of the present disclosure, the internal memory 232 may be in the form of a Solid State Drive (SSD). The external memory 234 may further include a flash drive, for example, a Compact Flash (CF), a Secure Digital (SD), a Micro-Secure Digital (Micro-SD), a Mini-Secure Digital (Mini-SD), an extreme Digital (xD), a memory stick, or the like.

The communication module 220 may include various communication circuitry, such as, for example, and without limitation, a cellular module 221, a wireless communication module 223 or a Radio Frequency (RF) module 229, each of which may include circuitry for performing the respective functions. The communication module 220 may be, for example, the communication interface 170 illustrated in FIG. 1. The communication module 220 may include various communication circuitry, such as, for example and without limitation, a Wi-Fi part 223, a BT part 225, a GPS part 227, or a NFC part 228. For example, the wireless communication module 220 may provide a wireless communication function by using a radio frequency. Additionally or alternatively, the wireless communication module 220 may include a network interface (e.g., a LAN card), a modulator/demodulator (modem), or the like for connecting the hardware 200 to a network (e.g., the Internet, a LAN, a WAN, a telecommunication network, a cellular network, a satellite network, a POTS, or the like).

The RF module 229 may be used for transmission and reception of data, for example, transmission and reception of RF signals or called electronic signals. Although not illustrated, the RF unit 229 may include, for example, a transceiver, a Power Amplifier Module (PAM), a frequency filter, a Low Noise Amplifier (LNA), or the like. Also, the RF module 229 may further include a component for transmitting and receiving electromagnetic waves in a free space in a wireless communication, for example, a conductor, a conductive wire, or the like.

The sensor module 240 may include, for example, at least one of a gesture sensor 240A, a gyro sensor 240B, an barometer sensor 240C, a magnetic sensor 240D, an acceleration sensor 240E, a grip sensor 240F, a proximity sensor 240G, a Red, Green and Blue (RGB) sensor 240H, a biometric sensor 240I, a temperature/humidity sensor 240J, an illumination sensor 240K, and a Ultra Violet (UV) sensor 240M, each of which may include circuitry for performing the respective functions. The sensor module 240 may measure a physical quantity or may sense an operating state of the electronic device 100, and may convert the measured or sensed information to an electrical signal. Additionally/alternatively, the sensor module 240 may include, for example, an E-nose sensor (not illustrated), an ElectroMyoGraphy (EMG) sensor (not illustrated), an ElectroEncephaloGram (EEG) sensor (not illustrated), an ElectroCardioGram (ECG) sensor (not illustrated), a fingerprint sensor (not illustrated), and the like. Additionally or alternatively, the sensor module 240 may include, for example, an E-nose sensor (not illustrated), an EMG sensor (not illustrated), an EEG sensor (not illustrated), an ECG sensor (not illustrated), a fingerprint sensor, and the like. The sensor module 240 may further include a control circuit (not illustrated) for controlling one or more sensors included therein.

The input device 250 may include various input circuitry, such as, for example, and without limitation, a touch panel 252, a pen sensor 254 (e.g., a digital pen sensor), keys 256, and an ultrasonic input unit 258. The input device 250 may be, for example, the user input module 140 illustrated in FIG. 1. The touch panel 252 may recognize a touch input in at least one of, for example, a capacitive scheme, a resistive scheme, an infrared scheme, and an acoustic wave scheme. Also, the touch panel 252 may further include a controller (not illustrated). In the capacitive type, the touch panel 252 is capable of recognizing proximity as well as a direct touch. The touch panel 252 may further include a tactile layer (not illustrated). In this event, the touch panel 252 may provide a tactile response to the user.

The pen sensor 254 (e.g., a digital pen sensor), for example, may be implemented by using a method identical or similar to a method of receiving a touch input from the user, or by using a separate sheet for recognition. For example, a key pad or a touch key may be used as the keys 256. The ultrasonic input unit 258 enables the terminal to sense a sound wave by using a microphone (e.g., a microphone 288) of the terminal through a pen generating an ultrasonic signal, and to identify data. The ultrasonic input unit 258 is capable of wireless recognition. According to an embodiment of the present disclosure, the hardware 200 may receive a user input from an external device (e.g., a network, a computer, or a server), which is connected to the communication module 230, through the communication module 230.

The display module 260 may include a display panel 262, a hologram 264, or projector 266. The display module 260 may be, for example, the display module 160 illustrated in FIG. 1. The display panel 262 may be, for example, a Liquid Crystal Display (LCD) or an Active Matrix Organic Light Emitting Diode (AM-OLED) display, or the like. The panel 262 may be implemented so as to be, for example, flexible, transparent, or wearable. The panel 262 may include the touch panel 252 and one module. The hologram 264 may display a three-dimensional image in the air by using interference of light. According to an embodiment of the present disclosure, the display module 260 may further include a control circuit for controlling the panel 262 or the hologram 264.

The interface 270 may include various interface circuitry, such as, for example, and without limitation, a High-Definition Multimedia Interface (HDMI) 272, a Universal Serial Bus (USB) 274, an optical interface 276, and a D-subminiature (D-sub) 278. Additionally or alternatively, the interface 270 may include, for example, SD/Multi-Media Card (MMC) (not illustrated) or Infrared Data Association (IrDA) (not illustrated).

The audio codec 280 may bidirectionally convert between a voice and an electrical signal. The audio codec 280 may convert voice information, which is input to or output from the audio codec 280, through, for example, a speaker 282, a receiver 284, an earphone 286, the microphone 288 or the like.

The camera module 291 may capture an image and a moving image. According to an embodiment, the camera module 291 may include one or more image sensors (e.g., a front lens or a back lens), an Image Signal Processor (ISP) (not illustrated), and a flash LED (not illustrated).

The power management module 295 may manage power of the hardware 200. Although not illustrated, the power management module 295 may include, for example, a Power Management Integrated Circuit (PMIC), a charger Integrated Circuit (IC), or a battery fuel gauge.

The PMIC may be mounted to, for example, an IC or a SoC semiconductor. Charging methods may be classified into a wired charging method and a wireless charging method. The charger IC may charge a battery, and may prevent an overvoltage or an overcurrent from a charger to the battery. According to an embodiment of the present disclosure, the charger IC may include a charger IC for at least one of the wired charging method and the wireless charging method. Examples of the wireless charging method may include a magnetic resonance method, a magnetic induction method, an electromagnetic method, and the like. Additional circuits (e.g., a coil loop, a resonance circuit, a rectifier, etc.) for wireless charging may be added in order to perform the wireless charging.

The battery fuel gauge may measure, for example, a residual quantity of the battery 296, or a voltage, a current or a temperature during the charging. The battery 296 may supply power by generating electricity, and may be, for example, a rechargeable battery.

The indicator 297 may indicate particular states of the hardware 200 or a part (e.g., the AP 211) of the hardware 200, for example, a booting state, a message state, a charging state and the like. The motor 298 may convert an electrical signal into a mechanical vibration. The processor 210 may control the sensor module 240.

Although not illustrated, the hardware 200 may include a processing unit (e.g., a GPU) for supporting a module TV. The processing unit for supporting a module TV may process media data according to standards such as, for example, Digital Multimedia Broadcasting (DMB), Digital Video Broadcasting (DVB), media flow, and the like. Each of the above-described elements of the hardware 200 according to an embodiment of the present disclosure may include one or more components, and the name of the relevant element may change depending on the type of electronic device. The hardware 200 according to an embodiment of the present disclosure may include at least one of the above-described elements. Some of the above-described elements may be omitted from the hardware 200, or the hardware 200 may further include additional elements. Also, some of the elements of the hardware 200 according to an embodiment of the present disclosure may be combined into one entity, which may perform functions identical to those of the relevant elements before the combination.

The term "module" used in the present disclosure may refer to, for example, a unit including one or more combinations of hardware (e.g., circuitry), software, and firmware. The "module" may be interchangeable with a term, such as "unit," "logic," "logical block," "component," "circuit," or the like. The "module" may be a minimum unit of a component formed as one body or a part thereof. The "module" may be a minimum unit for performing one or more functions or a part thereof. The "module" may be implemented mechanically or electronically. For example, the "module" according to an embodiment of the present disclosure may include at least one of processing circuitry, an Application-Specific Integrated Circuit (ASIC) chip, a Field-Programmable Gate Array (FPGA), and a programmable-logic device for performing certain operations which have been known or are to be developed in the future.

Figure 3:
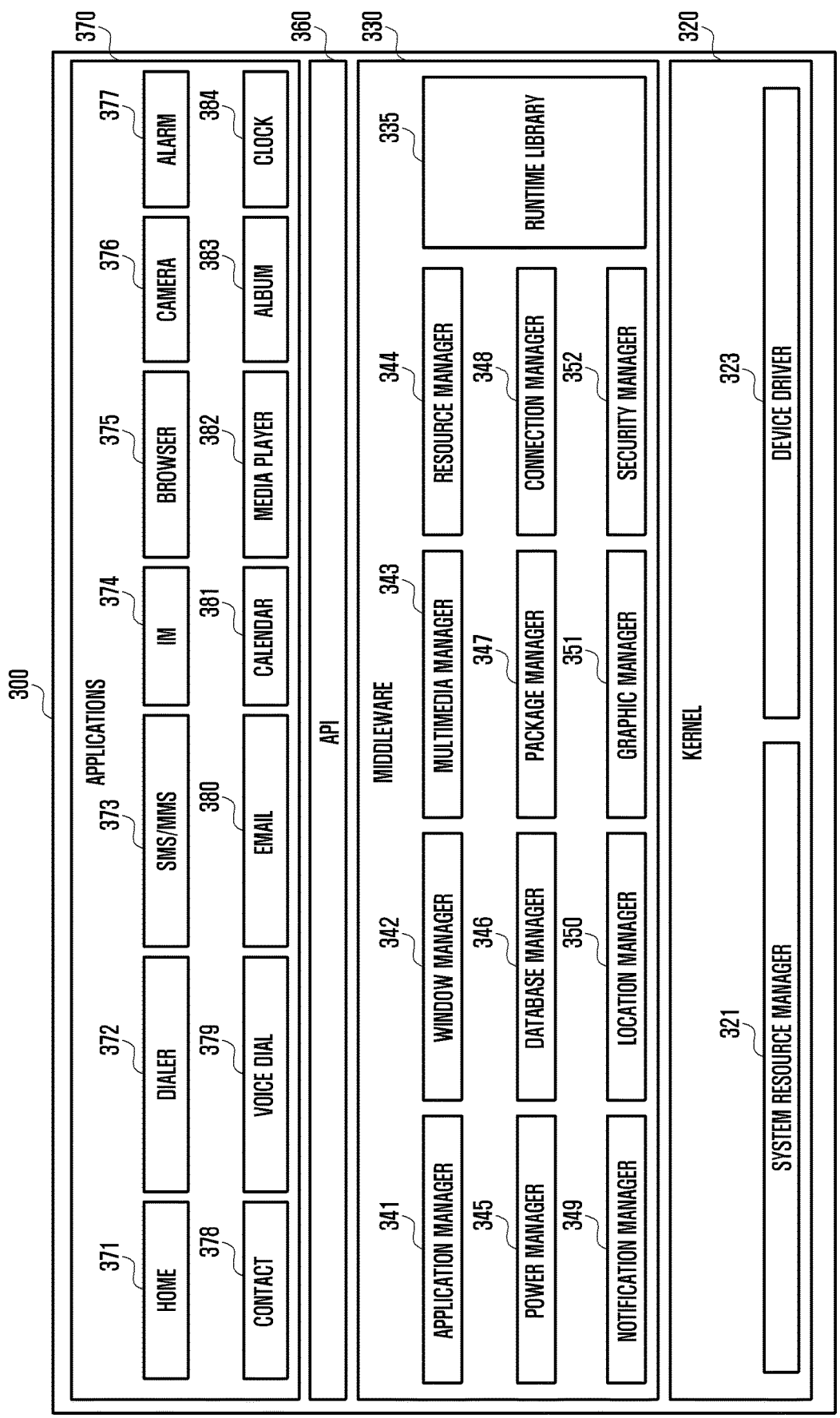
FIG. 3 is a block diagram illustrating a configuration of a program module according to various example embodiments of the present disclosure.

FIG. 3 is a block diagram illustrating an example configuration of a programming module 300 according to an example embodiment of the present disclosure.

The programming module 300 may be included (or stored) in the electronic device 101 (e.g., the memory 130) or may be included (or stored) in the electronic device 201 (e.g., the memory 230) illustrated in FIG. 1 or FIG. 2. At least a part of the programming module 300 may be implemented in software, firmware, hardware, or a combination of two or more thereof. The programming module 300 may be implemented in hardware (e.g., the hardware 200), and may include an OS controlling resources related to an electronic device (e.g., the electronic device 101/201) and/or various applications (e.g., an application 370) executed in the OS. For example, the OS may be Android, iOS, Windows, Symbian, Tizen, Bada, and the like.

Referring to FIG. 3, the programming module 300 may include a kernel 320, a middleware 330, an API 360, and/or the application(s) 370.

The kernel 320 (e.g., the kernel 141) may include a system resource manager 321 and/or a device driver 323. The system resource manager 321 may include, for example, a process manager (not illustrated), a memory manager (not illustrated), and a file system manager (not illustrated). The system resource manager 321 may perform the control, allocation, recovery, and/or the like of system resources. The device driver 323 may include, for example, a display driver (not illustrated), a camera driver (not illustrated), a Bluetooth driver (not illustrated), a shared memory driver (not illustrated), a USB driver (not illustrated), a keypad driver (not illustrated), a Wi-Fi driver (not illustrated), and/or an audio driver (not illustrated). Also, according to an embodiment of the present disclosure, the device driver 323 may include an Inter-Process Communication (IPC) driver (not illustrated).

The middleware 330 may include multiple modules previously implemented so as to provide a function used in common by the applications 370. Also, the middleware 330 may provide a function to the applications 370 through the API 360 in order to enable the applications 370 to efficiently use limited system resources within the electronic device. For example, as illustrated in FIG. 3, the middleware 330 (e.g., the middleware 143) may include at least one of a runtime library 335, an application manager 341, a window manager 342, a multimedia manager 343, a resource manager 344, a power manager 345, a database manager 346, a package manager 347, a connectivity manager 348, a notification manager 349, a location manager 350, a graphic manager 351, a security manager 352, and any other suitable and/or similar manager.

The runtime library 335 may include, for example, a library module used by a complier, in order to add a new function by using a programming language during the execution of the application 370. According to an embodiment of the present disclosure, the runtime library 335 may perform functions which are related to input and output, the management of a memory, an arithmetic function, and/or the like.

The application manager 341 may manage, for example, a life cycle of at least one of the applications 370. The window manager 342 may manage GUI resources used on the screen. The multimedia manager 343 may detect a format used to reproduce various media files and may encode or decode a media file through a codec appropriate for the relevant format. The resource manager 344 may manage resources, such as a source code, a memory, a storage space, and/or the like of at least one of the applications 370.

The power manager 345 may operate together with a Basic Input/Output System (BIOS), may manage a battery or power, and may provide power information and the like used for an operation. The database manager 346 may manage a database in such a manner as to enable the generation, search and/or change of the database to be used by at least one of the applications 370. The package manager 347 may manage the installation and/or update of an application distributed in the form of a package file.

The connectivity manager 348 may manage a wireless connectivity such as, for example, Wi-Fi and Bluetooth. The notification manager 349 may display or report, to the user, an event such as an arrival message, an appointment, a proximity alarm, and the like in such a manner as not to disturb the user. The location manager 350 may manage location information of the electronic device. The graphic manager 351 may manage a graphic effect, which is to be provided to the user, and/or a user interface related to the graphic effect. The security manager 352 may provide various security functions used for system security, user authentication, and the like. According to an embodiment of the present disclosure, when the electronic device (e.g., the electronic device 101) has a telephone function, the middleware 330 may further include a telephony manager (not illustrated) for managing a voice telephony call function and/or a video telephony call function of the electronic device.

The middleware 330 may generate and use a new middleware module through various functional combinations of the above-described internal element modules. The middleware 330 may provide modules specialized according to types of OSs in order to provide differentiated functions. Also, the middleware 330 may dynamically delete some of the existing elements, or may add new elements. Accordingly, the middleware 330 may omit some of the elements described in the various embodiments of the present disclosure, may further include other elements, or may replace the some of the elements with elements, each of which performs a similar function and has a different name.

The API 360 (e.g., the API 145) is a set of API programming functions, and may be provided with a different configuration according to an OS. In the case of Android or iOS, for example, one API set may be provided to each platform. In the case of Tizen, for example, two or more API sets may be provided to each platform.

The applications 370 (e.g., the applications 147) may include, for example, a preloaded application and/or a third party application. The applications 370 (e.g., the applications 147) may include, for example, a home application 371, a dialer application 372, a Short Message Service (SMS)/Multimedia Message Service (MMS) application 373, an Instant Message (IM) application 374, a browser application 375, a camera application 376, an alarm application 377, a contact application 378, a voice dial application 379, an electronic mail (e-mail) application 380, a calendar application 381, a media player application 382, an album application 383, a clock application 384, and any other suitable and/or similar application.

At least a part of the programming module 300 may be implemented by instructions stored in a non-transitory computer-readable storage medium. When the instructions are executed by one or more processors (e.g., the one or more processors 210), the one or more processors may perform functions corresponding to the instructions. The non-transitory computer-readable storage medium may be, for example, the memory 130/230. At least a part of the programming module 300 may be implemented (e.g., executed) by, for example, the one or more processors 120/210. At least a part of the programming module 300 may include, for example, a module, a program, a routine, a set of instructions, and/or a process for performing one or more functions.

Names of the elements of the programming module (e.g., the programming module 300) according to an embodiment of the present disclosure may change depending on the type of OS. The programming module according to an embodiment of the present disclosure may include one or more of the above-described elements. Alternatively, some of the above-described elements may be omitted from the programming module. Alternatively, the programming module may further include additional elements. The operations performed by the programming module or other elements according to an embodiment of the present disclosure may be processed in a sequential method, a parallel method, a repetitive method, or a heuristic method. Also, some of the operations may be omitted, or other operations may be added to the operations.

An electronic device according to various example embodiments of the present disclosure may comprise: a light emitting circuitry (e.g., reference number 1110 of FIG. 11) configured to output light including a predetermined frequency band; a display panel (e.g., reference number 1210 of FIG. 12) configured to display an image by using one or more pixels (e.g., sub-pixel P of FIG. 12), wherein the one or more pixels includes a plurality of sub-pixels; at least one driver circuit (e.g., FIG. 13) configured to drive at least one pixel among the plurality of sub-pixels; and an optical shielding layer (e.g., reference number 1540 of FIG. 15) formed adjacent to the at least one driver circuit in order to protect the at least one driver circuit from the light including a predetermined frequency band. The light including a predetermined frequency band may comprise an infrared light. The driver circuit may comprise: at least one thin-film transistor configured to include a semiconductor layer, gate electrode, source electrode, and drain electrode; at least one capacitor; and an organic light emitting diode (OLED). The light shielding material may be located by overlapping at least one part of the at least one thin-film transistor. The light shielding material may be formed to cover the whole upper part of the at least one thin-film transistor. The light shielding material may be formed to cover a space between the source electrode and the drain electrode. The light shielding material may be formed at a lower part of the at least one thin-film transistor. The light shielding material may be formed with a metal connected to the ground.

Alternatively, the electronic device according to various example embodiments of the present disclosure may comprise: a display including a display area and a non-display area, wherein at least one thin-film transistor is disposed in the display area; a biometric sensor disposed in at least one part of the display area of the display; and a processor configured to control the display and the biometric sensor. The display area may be divided into a first area disposing the biometric sensor and a second area excluding the first area. A light shielding material may be formed on the same or different layer as/from the at least one thin-film transistor in the first area. The biometric sensor may comprise: a light emitting circuitry for outputting light having a specific wave length and a light receiving circuitry for sensing the light having a specific wave length. The light shielding material may be configured with a material absorbing or reflecting the light output by the light emitting circuitry. The at least one thin-film transistor may comprise: a semiconductor layer; a gate electrode formed on a first insulator film covering the semiconductor layer and disposed by overlapping the semiconductor layer; and a source electrode and a drain electrode formed on a second insulator film covering the gate electrode and disposed by displacing each other across the gate electrode. The drain electrode may be connected electrically to an organic light emitting diode. The light shielding material may be formed on the same layer as the at least one thin-film transistor. The light shielding material can cover a front surface of the at least one thin-film transistor. The light shielding material may be formed to cover a part of the second insulator film including the source electrode and the drain electrode. The light shielding material may be formed to covers an upper part of the at least one thin-film transistor corresponding to a space between a source electrode and a drain electrode. The light shielding material may be formed to cover the source electrode, the drain electrode, and a second insulator film between the source electrode and the drain electrode. The light having a specific wave length output by the light emitting circuitry may comprise an infrared light. The light emitting circuitry may be disposed at a lower part of the at least one thin-film transistor. The light shielding material may be formed between the light emitting circuitry and the at least one thin-film transistor. The first area may comprise: a first layer formed with the at least one thin-film transistor; and a second layer formed with an organic light emitting diode on an upper part of the first layer. The biometric sensor may comprise a light emitting circuitry and a light receiving circuitry located on the same or different layer as/from the first and second layers.

Figure 4:
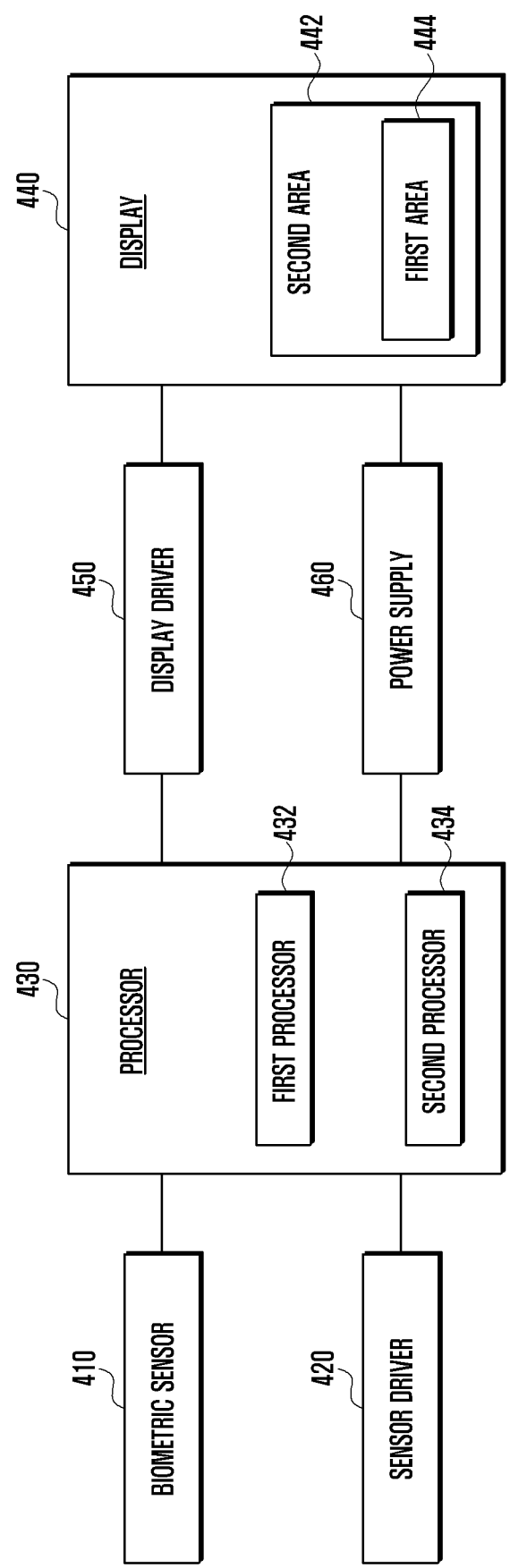
FIG. 4 is a block diagram illustrating a configuration of an electronic device according to an embodiment of the present invention.

FIG. 4 is a block diagram illustrating a configuration of an electronic device according to an example embodiment.

With reference to FIG. 4, the electronic device may include a biometric sensor 410, sensor driver 420, processor 430 (120/210), display 440 (160/260), display driver 450, and power supply 460.

The biometric sensor 410 may be a sensor using an infrared light. For example, the biometric sensor 410 may be a proximity sensor, illumination sensor, fingerprint sensor, and/or iris sensor. According to an example embodiment, at least one part of the biometric sensor can be disposed in a display area of the display 440. For example, a fingerprint sensor can be disposed in a part of the display area of the display 440 to detect user's fingerprint information according to a user's touch input.

The sensor driver 420 can drive the biometric sensor 410. The sensor driver 420 can transmit user's biometric information detected by the biometric sensor 410 to the processor 430. The sensor driver 420 can be configured according to the type of the biometric sensor 410. Alternatively, the sensor driver 420 can be configured with a single chip which can drive a plurality of biometric sensors 410. At least one part of the sensor driver 420 can be included in the processor 430 and/or the display driver 450.

The processor 430 may control each component of the electronic device. The processor 430 may have an identical or similar configuration to the processor 430 shown in FIG. 1, or processor 210 in FIG. 2. The processor 430 may include a first processor 432 and a second processor 434. The first processor 432 can control general drives of the electronic device. The second processor 434 can process information obtained by at least one sensor or input by a user without waking up the first processor if the electronic device is in a sleep state. According to an example embodiment, the second processor 434 can control the biometric sensor 410, touch sensor, or display 440 independently from the first processor 432.

The display 440 may be configured with an organic light emitting diode display. According to an example embodiment, the display 440 can be divided into a first area 444 in which is disposed at least one biometric sensor 410 and a second area 442 excluding the first area 444. According to various example embodiments, the biometric sensor 410 may be an optical sensor using an invisible light as a light source. The invisible light may mean a light having a frequency band excluding the range of visible light. For example, the invisible light may include an infrared light. According to an embodiment, the biometric sensor 410 may be a fingerprint sensor, proximity sensor, or iris sensor. The fingerprint sensor may mean a device for scanning user's fingerprint information and transmitting the scanned user's fingerprint information to a processor. The proximity sensor may mean a device for measuring a distance between an electronic device and a user and transmitting the measured distance to a processor. The iris sensor may mean a device for detecting user's iris information and transmitting the detected user's iris information to a processor.

According to an example embodiment, as an example of the biometric sensor 410, the fingerprint sensor can be disposed in the first area 444. For example, the fingerprint sensor can be integrated into a display area of the display 440 or at a lower part of the display area. According to an example embodiment, the fingerprint sensor can sense a user's fingerprint via an optical method. Further, the fingerprint sensor can use a light emitted from the display area of the display 440 as a light source for sensing the fingerprint, or a light emitting circuitry (e.g., reference number 1110 of FIG. 11) can be further installed separately from the display 440.

In a general drive state of an electronic device, the first area 444 can display a user interface or a specific image according to the control of the processor 430 or the display driver 450. According to an embodiment, in a sensing state of an electronic device, the first area 444 may or not display an image according to the control of the processor 430 or the display driver 450. In the sensing state of the electronic device, the biometric sensor 410 (e.g., fingerprint sensor) disposed in the first area 444 can be activated. According to an embodiment, in a sleep state (or locked state), the first area 444 can detect a user's touch or hovering input periodically according to the control of the processor 430 or the display driver 450. In the sleep state of the electronic device, the biometric sensor 410 (e.g., fingerprint sensor) can be activated if a user's touch or hovering input is detected. The sensing state of the electronic device may be a state for detecting user's biometric information, or a state that a display area disposed with the biometric sensor 410, sensor driver 420, and the biometric sensor 410 is activated, or a touch sensor disposed with the biometric sensor 410 is activated. The sleep state of the electronic device may be a low power drive state or a locked state of the electronic device, namely, a state that only the components for detecting a user input to release the sleep state are driving and a low power processor (e.g., second processor 434) is driving to control the components.

In a general drive state of an electronic device, the second area 442 can display a user interface or a specific image according to the control of the processor 430 or the display driver 450. According to an embodiment, in a sensing state of the electronic device, the second area 442 can continue to provide a previous user interface or a specific image. Alternatively, in the sleep state of the electronic device, the second area 442 can be deactivated under the control of a low power processor (e.g., the second processor 434).

The display driver 450 can drive the display 440 under the control of the processor 430. The display driver 450 may include an interface block for exchanging commands or data with an application processor 430 (hereinafter, AP) or a second processor 434 (e.g., low power processor; hereinafter, LPP); a graphic memory for storing image data received from the AP or LPP; a mixer for controlling a signal path of data received from the interface block or graphic memory, a processing module for compensating image data or processing biometric information; a memory for storing location information or address information of a first area 444 formed with an optical sensor (e.g., biometric sensor, proximity sensor, illumination sensor, and image sensor); a mapping module for determining and processing image data corresponding to the first area 444 and second area 442 by using the location information or the address information of the first area 444; a source driver for driving pixels of the display 440 in an analog method; a sensor formed in the first area 444 of the display 440 to obtain biometric information so that data processed by the mapping module corresponding to the first area 444 and second area 442 can be displayed through the display 440; and a separate sensor driver 420 for driving the sensor, transmitting information obtained from the sensor to the processing module, AP, and LLP, or receiving commands from the processing module, AP, and LLP.

According to an embodiment of the present invention, the first area 444 and the second area 442 can be controlled by separate processors such as a first processor 432 and a second processor 434. Alternatively, the first area 444 and the second area 444 can be controlled by one processor. In this case, switching on/off of a biometric sensor (e.g., fingerprint sensor) corresponding to the first area 444 can be controlled only by the low power processor (e.g., second processor 434).

The power supply 460 can supply a voltage required for driving each component of the electronic device. For example, the power supply 460 can generate a plurality of drive voltages by converting a basic voltage supplied by a battery and supply the plurality of generated drive voltages to each component of the electronic device.

Figure 5A:
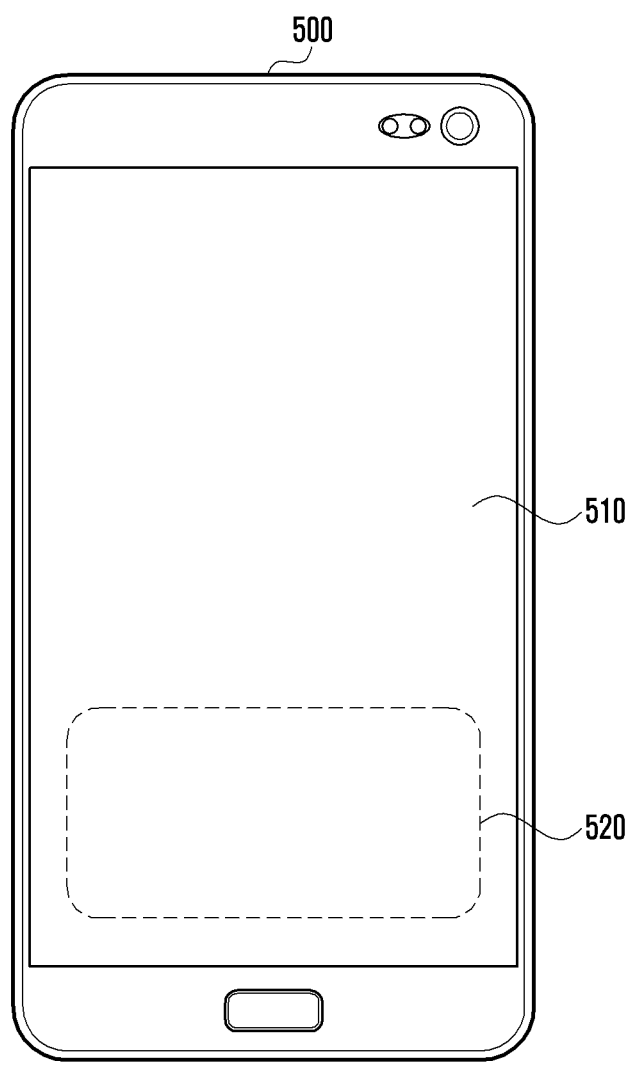
FIGS. 5A and 5B illustrate examples of an electronic device according to various example embodiments of the present disclosure.
Figure 5B:
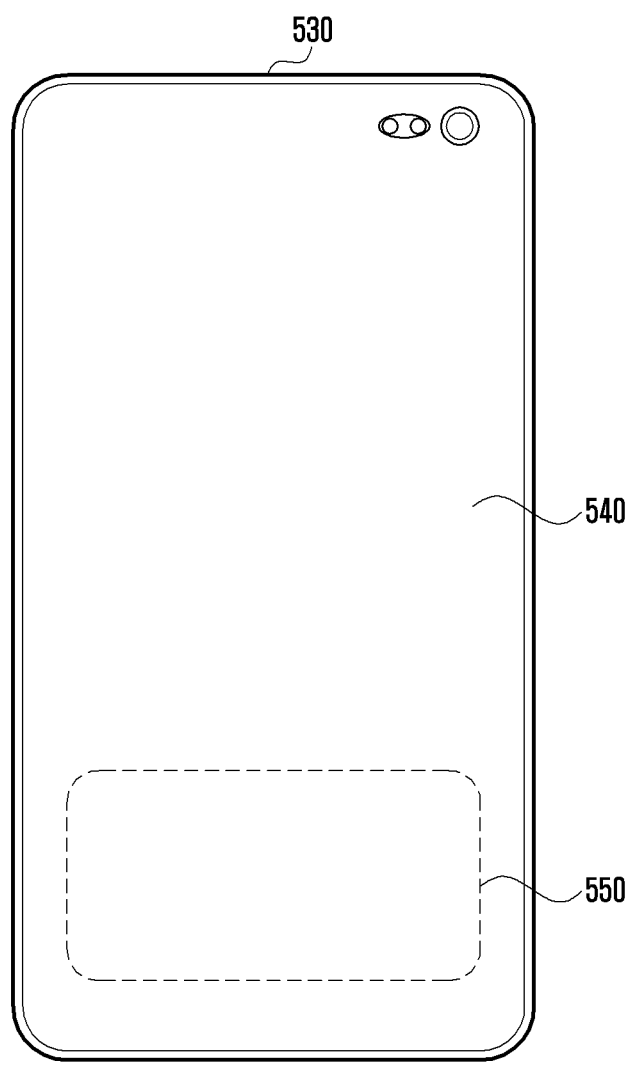

FIGS. 5A and 5B illustrate examples of an electronic device according to various example embodiments of the present disclosure.

With reference to FIG. 5A, the electronic device 500 (e.g., electronic device 101/201) may include a biometric sensor 520 (e.g., 410) (e.g., fingerprint sensor) for recognizing biometric information (e.g., fingerprint information) formed in at least one part of a display 510 (e.g., display 160/260/440). By forming the biometric sensor 520 in the at least one part (e.g., active area or black matrix (BM) area) of the display 510, user's biometric information can be obtained by using a user input generated in the display 510.

With reference to FIG. 5B, the electronic device 530 (e.g., electronic device 101) may include a biometric sensor 550 in at least one part of a display 540 (e.g., display 160), and can expand a display size by forming an area occupied by the biometric sensor 550 as the display 540.

Figure 6:
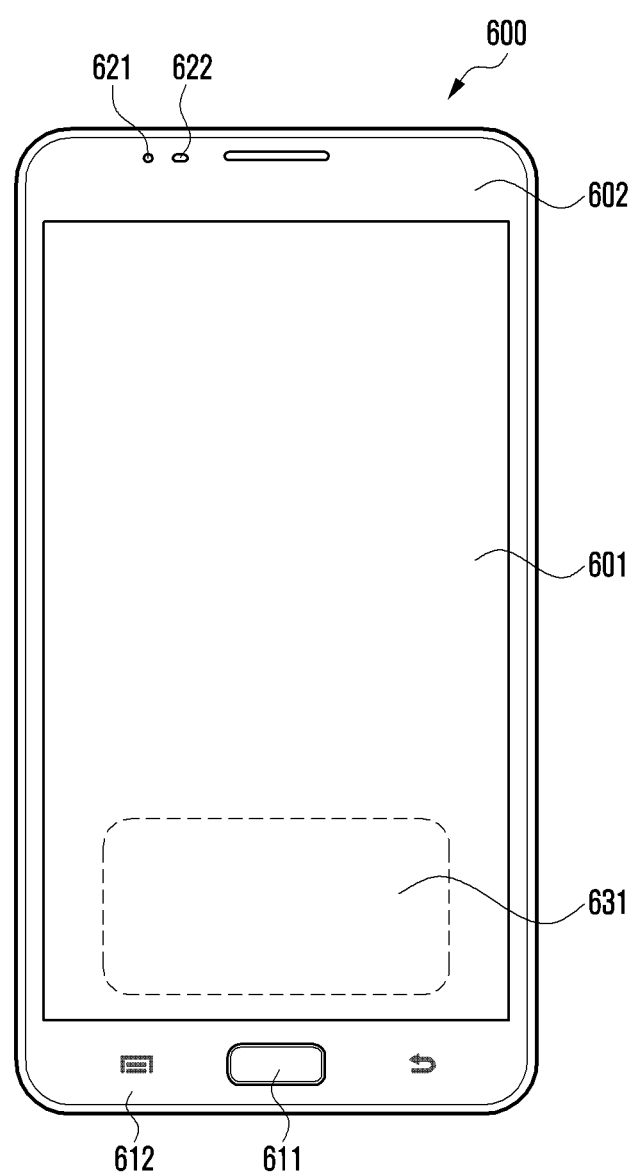
FIG. 6 is a front view illustrating an electronic device according to an example embodiment of the present disclosure.

FIG. 6 is a front view illustrating an electronic device (e.g., 600/101/201) according to an embodiment of the present invention.

With reference to FIG. 6, a display 601 can be disposed at a front surface of the electronic device 600 according to an embodiment. In the display 601, an area locating a screen can be a display area. In the display 601, the remaining area excluding the display area can be defined as a non-display area 602. For example, the non-display area 602 may be at least one area surrounding the display area of the display at the front surface of the electronic device 600. Alternatively, the non-display area 602 can be defined as a bezel area of the front surface of the electronic device 600.

According to an embodiment, at least one button 611 and/or 612 for operating functions of the electronic device 600 can be installed in the non-display area 602. The button is configured in a separate hole or groove formed at a glass covering the front surface of the electronic device 600, and can be an operation key which can be physically pressed. The operation button 611 may be a home button provided in the non-display area 602 of the electronic device 600. The home button can be disposed at a lower part of the non-display area 602 in the electronic device 600 as shown by reference number 611. The home button 611 may be used for switching to an initial screen when the electronic device 600 executes a specific application. Alternatively, the at least one button 612 can be a touch input button different from the home button 611.

According to an embodiment, the electronic device 600 may include at least one biometric sensor 621, 622, and/or 631. The at least one biometric sensor can be disposed in the non-display area 602 or in the display area. The at least one biometric sensor may be a proximity sensor 621, illumination sensor 622, fingerprint sensor 631, and/or iris sensor. For example, some parts 621 and 622 among the plurality of biometric sensors can be disposed in the non-display area 602, and another part 631 can be disposed in the display area as shown in FIG. 6. For example, the proximity sensor can be disposed at an upper part of the non-display area 602 in the electronic device 600 as shown by reference number 621. The illumination sensor can be disposed at an upper part of the non-display area 602 in the electronic device 600 as shown by reference number 622. The fingerprint sensor 631 can be disposed in the display area (e.g., screen area) of the display 601.

Figure 7:
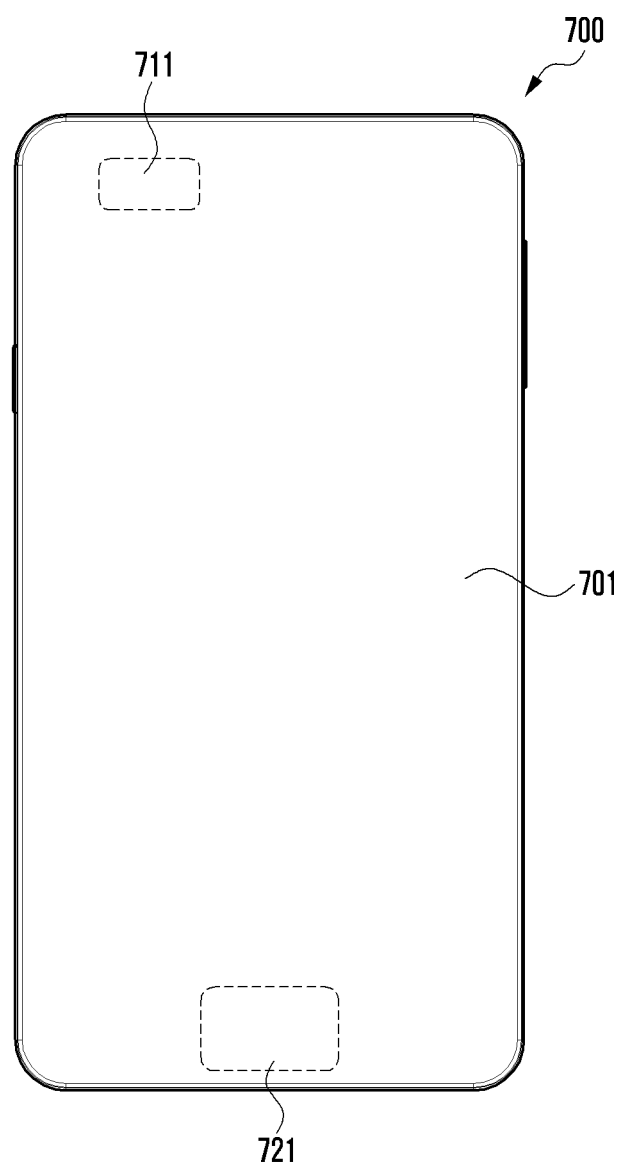
FIG. 7 is a front view illustrating an electronic device according to another example embodiment of the present disclosure.

FIG. 7 is a front view illustrating an electronic device 700/101/201 according to another embodiment of the present invention.

According to another embodiment of the present invention with reference to FIG. 7, the whole front surface of the electronic device 700 can be configured with a display. For example, the non-display area can be deleted from the electronic device 700. Alternatively, the electronic device 700 may have a smaller width in the non-display area comparing to the electronic device 600 shown in FIG. 6.

According to an embodiment, biometric sensors 711 and 721 can be installed in at least one part of a display area 701. For example, the biometric sensors 711 and 721 may be a proximity sensor, illumination sensor, fingerprint sensor, or iris sensor. For example, the proximity sensor or the illumination sensor can be disposed at an upper part of the display area 701 in the electronic device 700 as shown by reference number 711. The fingerprint sensor can be disposed at a lower part of the display area 701 in the electronic device 700 as shown by reference number 721. According to various embodiments, locations of the biometric sensors 711 and 721 can be predetermined in the display area 701, and address information of the predetermined biometric sensors 711 and 721 can be stored in a memory.

Various example embodiments of the present disclosure include at least one biometric sensor, and the at least one biometric sensor can be disposed in a lower part of the display area 701. Accordingly, the present invention can reduce a design margin of the non-display area and increase the display area.

According to various embodiments, at least one biometric sensor corresponding to the display area 701 can identify user's biometric information in an optical method. For example, a fingerprint sensor can be disposed in a first area of the display area 701 and to sense users fingerprint information in an optical method.

According to various example embodiments of the present disclosure, the biometric sensors 711 and/or 721 can be formed integrally in a display. For example, the biometric sensors 711 and 721 can be disposed on at least one layer configuring the display. Alternatively, the biometric sensors 711 and/or 721 according to another embodiment of the present invention can be disposed by overlapping at least one area of the display area 701 (e.g., areas indicated by reference numbers 711 and 721 of FIG. 7).

Figure 11:
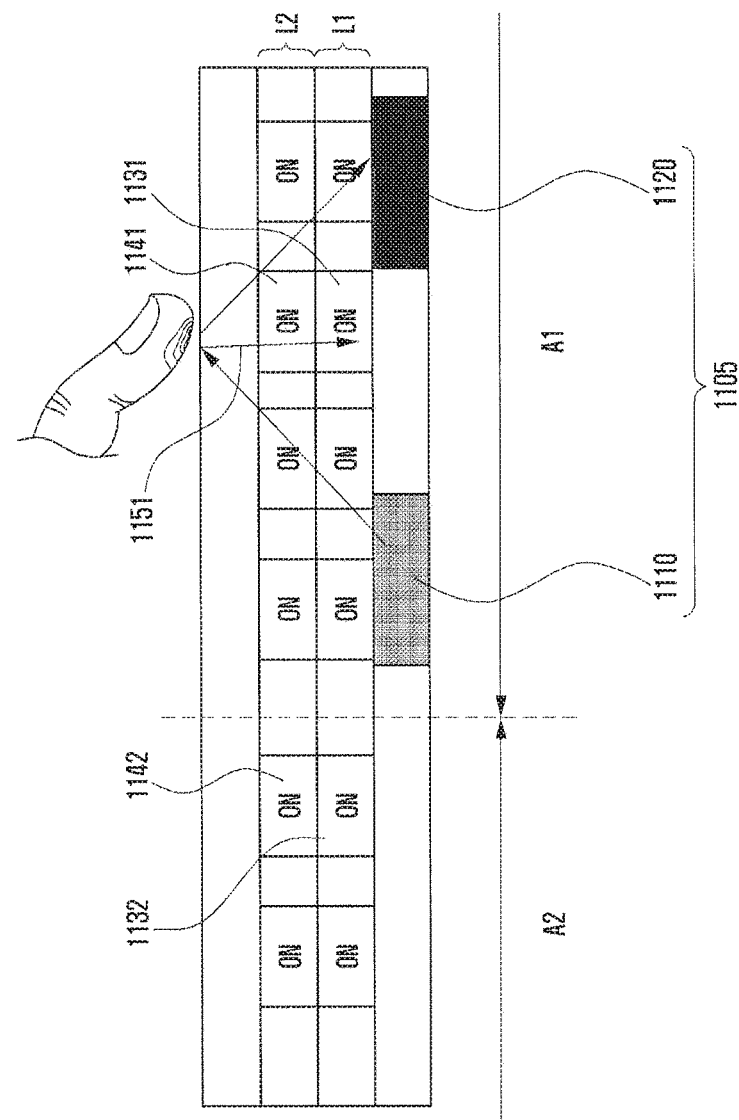
FIG. 11 is a schematic cross sectional view illustrating an electronic device in a sensing state.

For example, the fingerprint sensor may include light emitting circuitry (e.g., reference number 1110 of FIG. 11) and light receiving circuitry (e.g., reference number 1120 of FIG. 11). The light emitting circuitry can emit light having a specific wave length. If the light emitted by the light emitting circuitry 1110 is reflected by a user's finger, the light receiving circuitry 1120 can identify a fingerprint by sensing the reflected light. Hereinafter, for the convenience in description and for purposes of example, it is assumed that the biometric sensor disposed in the display area 701 is a fingerprint sensor. However, the biometric sensor disposed in the display area 701 can vary besides the fingerprint sensor. For example, the biometric sensor disposed in the display area 701 can be a proximity sensor, illumination sensor, or iris sensor.

In the expressions described in the present disclosure, the fact that a fingerprint sensor is integrated into the display area 701 of the display may mean that the fingerprint sensor is integrated into a pixel(s) configuring the display area 701 of the display. Alternatively, the fact that the fingerprint sensor is integrated into the display area 701 of the display may mean that the fingerprint sensor is configured separately from the pixel(s) configuring the display area 701 of the display.

If the fingerprint sensor is configured separately from a pixel(s) configured in the display area 701 of the display, the fingerprint sensor can be disposed by overlapping a lower part of the pixel configured in the display area 701 or disposed at the same layer of the pixel. For example, the fingerprint sensor can be disposed at a lower part of a thin-film transistor and an organic light emitting layer configured in the pixel of the display. Alternatively, the fingerprint sensor can be disposed at an upper part of the thin-film transistor and the organic light emitting layer configured in the pixel.

According to various embodiments, the display area 701 can be divided into a first area disposing at least one biometric sensor and a second area excluding the first area. The second area may be an area where a biometric sensor is not disposed. For example, the areas indicated by reference numbers 711 and 721 of FIG. 7 correspond to the first area where biometric sensors are disposed. Alternatively, the area indicated by reference number 701 corresponds to the second area where no biometric sensor is disposed.

Hereinafter, it will be described by assuming that the area indicated by reference number 721 of FIG. 7 is a first area and the area indicated by reference number 701 is a second area.

The first area 721 may display an image in a normal drive period and collect user's fingerprint information while executing a specific function (e.g., user authentication function) and activating a fingerprint sensor. Alternatively, the first area 721 may not display an image in a sleep state of the electronic device 700 but may recognize user's fingerprint information by activating the fingerprint sensor.

The second area 701 may display an image regardless of the normal drive period or the specific function execution period. For example, unless the specific function is executed, both the first are 721 and the second area 701 may display normal images. If the specific function is executed, the first area 721 can collect user's fingerprint information by activating a fingerprint sensor instead of displaying the normal image, but the second area 701 can display the normal image. Alternatively, the second area 701 may not display an image in a sleep state of the electronic device 700.

The sleep state may be a locked state of the electronic device 700. For example, if the electronic device 700 becomes a sleep state, a low power processor drives and the electronic device 700 can periodically detect only the operation of the fingerprint sensor or the touch sensor disposed in the first area 721 under the control of the low power processor. Operations of the remaining devices configured in the electronic device 700 may stop. According to an embodiment, if the electronic device 700 becomes the sleep state, the electronic device 700 can detect an input of at least one button predetermined for releasing the locked state.

According to an embodiment, if fingerprint sensing is required while displaying a normal image through the first area 721 and second area 701, the electronic device 700 can detect a user's touch input from the first area 721 and control at least one part of the first area 721 differently. If a user touch is generated in the first area 721, an operation of changing an attribute of a pixel corresponding a user's touch area can be performed. For example, the electronic device 700 can perform an operation of preferentially switching on R (Red) and G (Green) values of the pixel corresponding to the user's touch area or switching off a B (Blue). Alternatively, the electronic device 700 can secure a light source for recognizing a fingerprint by increasing the brilliance of the pixel corresponding to the touch area. A partial control or change of the display can be performed dynamically corresponding to a user's touch movement. The partial control may include a partial brightness control not only for the pixel but also for a partial area of the display (e.g., first area and second area).

Figure 8:
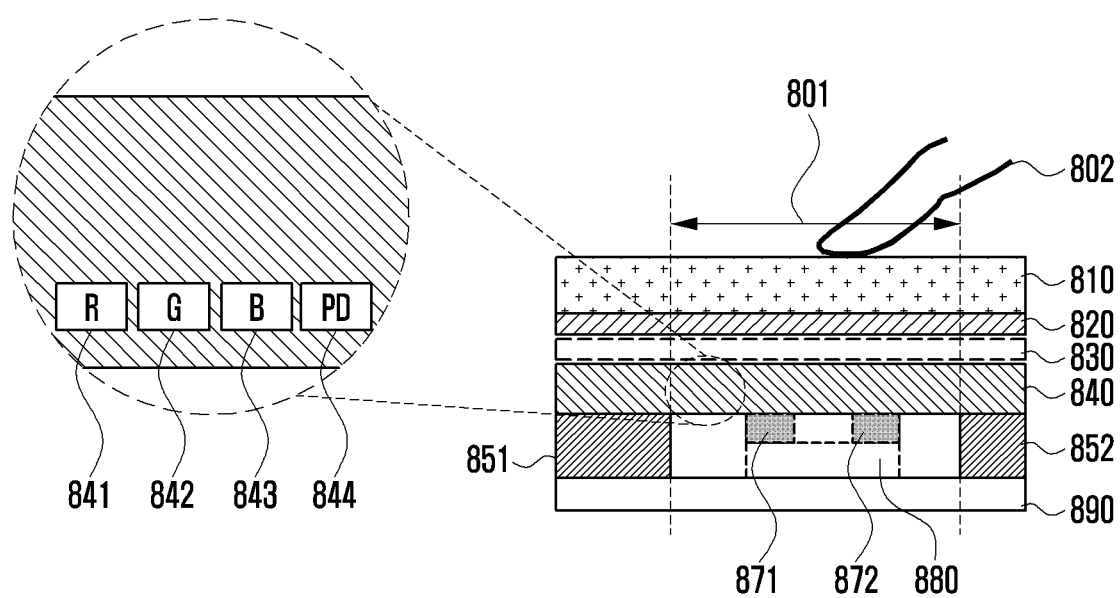
FIG. 8 illustrates an example structure of installing a biometric sensor in an electronic device according to various example embodiments of the present disclosure.

FIG. 8 illustrates an example structure of installing a biometric sensor (e.g., biometric sensor 520 of FIG. 5A or biometric sensor 550 of FIG. 5B) in an electronic device (e.g., electronic device 500 of FIG. 5A or electronic device 530 of FIG. 5B) according to various example embodiments of the present disclosure.

With reference to FIG. 8, the electronic device may include a glass 810, biometric sensor 830, display 840, biometric sensor 880, or PCB 890. The glass 810 can be attached to the biometric sensor 830 and/or the display 840 by using an adhesive 820. According to an embodiment, the electronic device may further include structures 851 and 852 in order to secure an installation space for the biometric sensor 880. The structures 851 and 852 can form at least one part of a sealing structure for protecting the biometric sensor 880.

According to an embodiment, the biometric sensors 830 and 880 can be formed at a partial area (e.g., one area or a plurality of areas) of the display 840 or at the whole area (e.g., active area of the display).

According to an embodiment, biometric sensors 830 and 844 for detecting fingerprint information can be formed at a side of the display (e.g., separate layer on an upper surface of the display or at least one partial area of a surface formed with pixels 841, 842, and 843 of the display). According to an embodiment, the biometric sensor 880 can be formed another side (e.g., rear surface) of the display. The biometric sensors 830, 844, and 880 may include an optical image sensor, ultrasonic transmission/reception module, or electrostatic electrode pattern.

According to various embodiments, the biometric sensor 830 can be formed between the adhesive layer 820 and the display 840 or between the glass 810 and the adhesive layer 820. According to an embodiment, the biometric sensor 830 can be formed in an electrostatic transmission/reception electrode pattern, and can be formed with a transparent electrode in order to increase a penetration ratio of light output by the display 840. According to an embodiment, the biometric sensor 830 can also include an ultrasonic transmission/reception module.

According to various embodiments, the biometric sensor 880 can be formed at another side of the display of the electronic device. Elastomers 871 and 872 (e.g., sponge or rubber) can be formed between the biometric sensor 880 and the display 840 in order to relax an impact or protect an inflow of foreign materials between the biometric sensor 880 and the display 840. According to an embodiment, the biometric sensor 880 may include an image sensor. For example, the image sensor can output light (e.g., visible light or infrared light) emitted by a light source (e.g., the display 840 or an infrared light emitting diode (IR LED) to a user's fingerprint, and detect the light reflected by the users fingerprint.

FIG. 9 is a block diagram illustrating another example of an electronic device according to various example embodiments of the present disclosure.

According to an embodiment, the electronic device 900 (e.g., electronic device 500 of FIG. 5A or electronic device 530 of FIG. 5B) may include a plurality of controllers (e.g., first controller 912, second controller 922, third controller 943, fourth controller 953, or ninth controller 960). Each controller can be included in modules (e.g., first processor 910, second processor 920, DDI 941, or biometric sensor 951) included in the electronic device 900. For example, the electronic device 900 can control the first processor 910 by using the first controller 912 and the second processor 920 by using the second controller 922. Further, the electronic device 900 may include the third controller 943 and the fourth controller 953 and can control the modules by using the third controller 943 and the fourth controller 953.

According to an embodiment, the modules of the electronic device 900 can be controlled by using one controller. For example, the electronic device 900 can control a plurality of controllers (e.g., first controller 912, second controller 922, third controller 943, and fourth controller 953) by using a main controller (e.g., ninth controller 960). Further, the electronic device 900 can designate a main controller, and control other controllers by using the designated main controller. For example, the electronic device 900 can change the main controller from the ninth controller 960 to the first controller 912, and control other controllers by using the changed main controller.

According to an embodiment, the modules of the electronic device 900 can be controlled by using one controller. For example, the electronic device 900 can control the second processor 920, memory 930, display 940, and/or at least one sensor 450 by using the first controller 912 included in the first processor 910. According to another embodiment, the display 940 and at least one sensor 950 can be controlled by one controller. For example, in case of a biometric sensor (e.g., fingerprint sensor) using the display 940 as a light source, the display 940 and the sensor 950 can be controlled by using one controller, and user's biometric information can be easily obtained.

FIG. 10 illustrate a method for controlling a display while an electronic device is sensing fingerprint information according to an example embodiments of the present disclosure.

According to an embodiment, the electronic device may be in an application operating state or in a sensing state based on a user input. The sensing state of the electronic device may be a state that authentication related to user's biometric information is requested. For example, the electronic device can switch to the sensing state and request a user for fingerprint authentication if a mobile banking application is being executed. Alternatively, the electronic device can switch to the sensing state for logging in a specific web site and request the user for fingerprint authentication if a web browser is being executed.

Figure 10B:
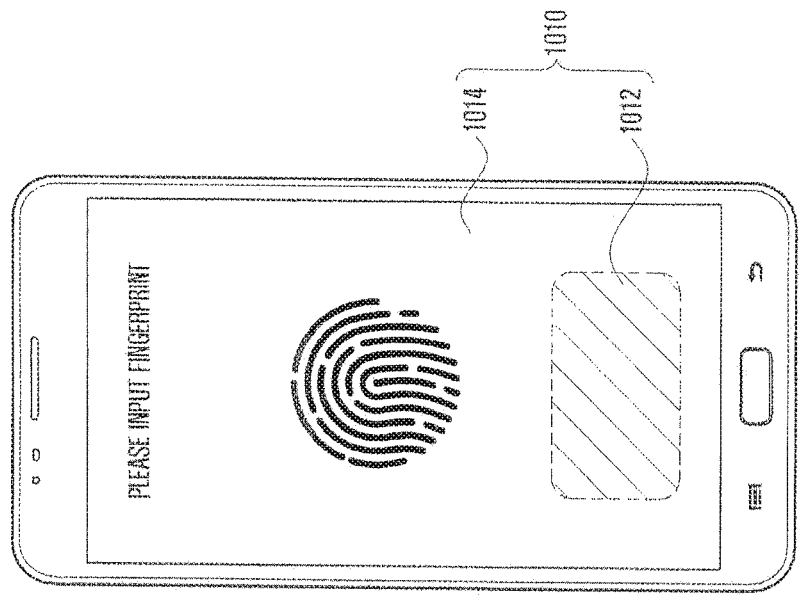
FIGS. 10(a)-(10b) illustrate a method for controlling a display while an electronic device is sensing fingerprint information according to an example embodiments of the present disclosure.
Figure 10A:
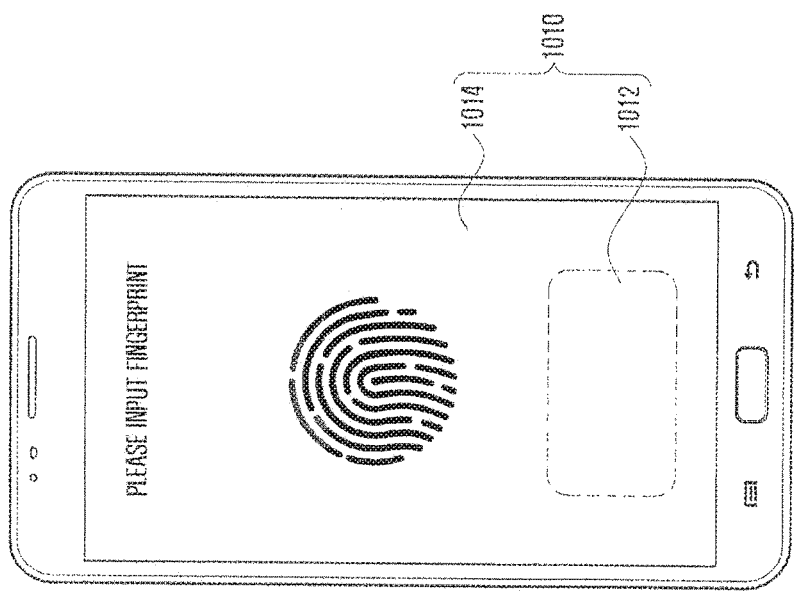

The sensing state of the electronic device can include a first state shown by FIG. 10A and a second state shown by FIG. 10B.

In the first state, the electronic device can request a user for biometric information authentication and detect a user's touch or hovering from at least one part of a display 1010. For example, the electronic device can display a message requesting the user for a fingerprint input by controlling a second area 1014 of the display 1010 in the first state. Further, in the first state, the electronic device can detect a user's touch or hovering input by using a touch sensor disposed in a first area 1012 of the display 1010.

If a user's touch or hovering is detected from at least one part of the display 1010, the electronic device can identify user's biometric information by activating a biometric sensor. For example, if a user's touch or hovering input is detected from the first area 1012 in the second state, the electronic device can sense user's biometric fingerprint information by activating a biometric sensor.

FIG. 11 is a schematic cross sectional view illustrating an electronic device in a sensing state.

According to an embodiment of the present invention, optical fingerprint sensors 1105 can be disposed in at least one part of a display area of a display, and the fingerprint sensors 1105 can identify user's biometric information. Accordingly, if a light emitting circuitry 1110 outputs light having a specific wave length (e.g., light including a predetermined frequency band and/or infrared light) by activating the fingerprint sensor 1105, the corresponding light can enter at least one thin-film transistor 1131 and 1132 provided in a display area of a display. The at least one thin-film transistor 1131 and 1132 may be configured to drive organic light emitting diodes 1141 and 1142 of the corresponding display area. Accordingly, if the light (e.g., infrared light) output by the light emitting circuitry 1110 enters the thin-film transistors 1131 and/or 1132, this may lead malfunctions of the thin-film transistors 1131 and/or 1132. For example, the thin-film transistors 1131 and 1132 can generate an unintentional leak current, if the light output by the light emitting circuitry 1110 is directly received or if the light output by the light emitting circuitry 1110 is reflected by a user's fingerprint. If the leak current generates, this may lead a malfunction of a display (e.g., light leaking phenomenon).

For example, as shown in the drawing, the display area can be divided into a first area A1 disposing the fingerprint sensors 1105 and a second area A2 excluding the first area A1. The second area A2 may be an area where the fingerprint sensors 1105 are not disposed. The cross section of the display may include a first layer L1 formed with at least one thin-film transistor 1131 and 1132, and a second layer L2 located at an upperpart of the first layer L1 and formed with organic light emitting diodes (OLED) 1141 and 1142. The fingerprint sensors 1105 may include a light emitting circuitry 1110 and a light receiving circuitry 1120 located at a lower part of the first layer L1. The light emitting circuitry 1110 can emit light having a specific wave length (e.g., light including a predetermined frequency band). If the light emitted by the light emitting circuitry 1110 is reflected by a user's fingerprint, the light receiving circuitry 1120 can identify the fingerprint by sensing the reflected light.

While the light emitting circuitry 1110 and the light receiving circuitry 1120 are operating, at least one part of the light emitted by the light emitting circuitry 1110 can penetrate the first layer L1 and the second layer L2 of the display. Accordingly, the at least one part of the light can enter a thin-film transistor 1131 located in the first area A1, and generate an unintentional leak current. Various example embodiments of the present disclosure can avoid the leak current and light leakage by forming a structure for preventing/reducing the thin-film transistor 1131 from receiving the incoming light. Example structure will be described in detail with reference to FIGS. 14 to 17.

Figure 12:
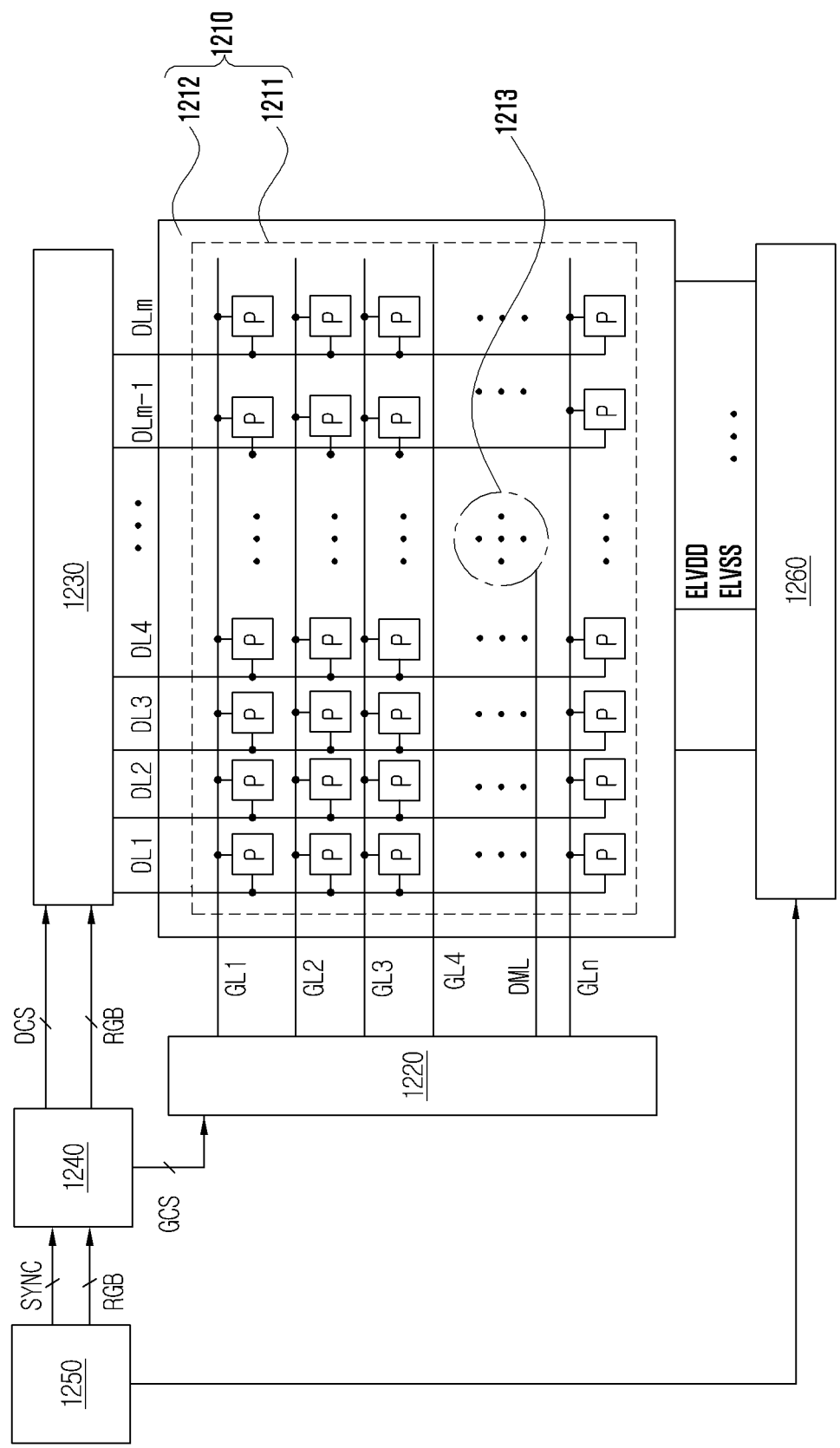
FIG. 12 illustrates a configuration of a display and a display driver according to various example embodiments of the present disclosure.

FIG. 12 illustrates a configuration of a display and a display driver according to various example embodiments of the present disclosure.

With reference to FIG. 12, a display 1210 (e.g., display 160/260) may include a display area 1211 and a non-display area 1212. According to an example embodiment, the display 1210 is configured with a plurality of pixels, and the pixels may include a plurality of sub-pixels P. The display 1210 may include a plurality of gate lines GL1~GLn and a plurality of data lines DL1~DLm intersecting each other. Sub-pixels P may be formed in an area proximate where the gate line GL and the data line DL intersect each other. Each sub-pixel P may include an organic light emitting diode (OLED), and there may be provided at least one driver circuit for driving the OLED. A display driver (e.g., DDI 741) driving the display 1210 may include a gate driver 1220, data driver 1230, timing controller 1240, and interface block 1250. The display area 1211 may include a first area 1213 disposed with a fingerprint sensor, and the first area 1213 may include a separate dummy line DML connected to the gate driver 1220. The electronic device (e.g., electronic device 101) can turn off a drive thin-film transistor connected to a light emitting signal line by supplying a gate off voltage only to the first area 1213 through the dummy line DML in a sensing state.

Driving circuitry installed for each sub-pixel P may include at least one thin-film transistor (e.g., reference numbers. 1510 of FIG. 15), at least one capacitor, and/or organic light emitting diodes (OLED). The at least one thin-film transistor can charge a capacitor with a data voltage supplied from the data line DL responding to a scan signal received from the gate line GL. The at least one thin-film transistor can control an electric current amount supplied to an organic light emitting diode according to the charged data voltage in the capacitor.

The gate driver 1220 can transmit a scan signal to a plurality of gate lines GL1~GLn according to at least one gate control signal GCS transmitted by the timing controller 1240. The gate driver 1220 may include a gate shift register for outputting a scan signal (or scan pulse). The scan signal is transmitted sequentially to each pixel, and may be configured with a single signal or a plurality of signals. If the scan signal is configured with a plurality of signal, each gate line GL may be configured with a plurality of lines in order to transmit the plurality of scan signal to each pixel.

The data driver 1230 can convert image data RGB transmitted by the timing controller 1240 to a data voltage according to at least one data control signal DCS transmitted by the timing controller 1240. The data driver 1230 can generate the data voltage by using a plurality of gamma compensation voltages. The data driver 1230 can supply the generated data voltage sequentially to a plurality of pixels in a line unit (e.g., row unit). The data driver 1230 may include a data shift register for outputting a sampling signal, latch circuit for latching image data in a row unit responding to the sampling signal, and digital analog converter for converting the latched image data to an analog gradation voltage (pixel voltage).

The timing controller 1240 can arrange the image data RGB provided by the interface block 1250 to fit the size and resolution of the display 1210. The timing controller 1240 can transmit the arranged image data RGB to the data driver 1230. The timing controller 1240 can transmit a plurality of control signals GCS and DCS by using at least one synchronization signal SYNC provided by the interface block 1250. The plurality of control signals GCS and DCS may include at least one gate control signal GCS and at least one data control signal DCS. The gate control signal GCS may be a signal for controlling a drive timing of the gate driver 1220. The data control signal DCS may be signal for controlling a drive timing of the data driver 1230. The synchronization signals SYNC may include a dot clock DCLK, data enable signal DE, horizontal synchronization signal Hsync, or vertical synchronization signal Vsync. According to an embodiment of the present invention, the interface block 1250 can receive image data RGB from a processor (e.g., application processor), and transmit the received image data RGB to the timing controller 1240. The interface block 1250 can generate at least one synchronization signal SYNC to transmit to the timing controller 1240. The interface block 1250 can control the power supply 1260 (e.g., power supply 460) to supply at least one drive voltage ELVDD and ELVSS to the display 1210.

According to an embodiment of the present invention, the power supply 1260 can generate at least one drive voltage ELVDD and ELVSS required for driving the display 1210, and supply the generated drive voltage ELVDD and ELVSS to the display 1210. According to an embodiment, the power supply 1260 may be configured in a singular or plural form, and can supply at least one drive voltage ELVDD and ELVSS independently to the first area 1213 disposed with a fingerprint sensor and to an area excluding the first area 1213 (e.g., second area). The at least one drive voltage may include an ELVDD, ELVSS, gate on voltage, gate off voltage, or initialization voltage. The gate on voltage may be a voltage for turning on at least one thin-film transistor installed in the display. The gate off voltage may be a voltage for turning off at least one thin-film transistor installed in the display. The initialization voltage may be a voltage for initializing at least one node installed in a drive circuit for driving at least one sub-pixel P among a plurality of sub-pixels P.

Figure 13:
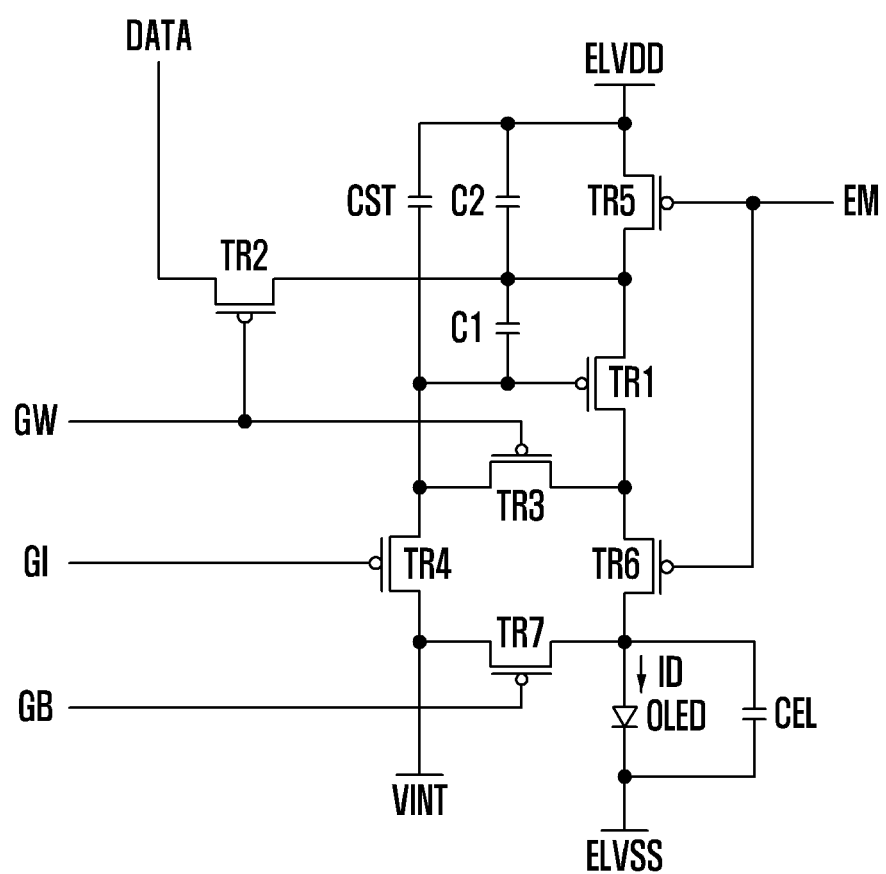
FIG. 13 illustrates a driver circuit according to various example embodiments of the present disclosure.

FIG. 13 illustrates a driver circuit according to various example embodiments of the present disclosure.

According to various embodiments, each pixel of the display can be configured as shown in FIG. 13. With reference to FIG. 13, the drive circuit for driving at least one pixel P among a plurality of sub-pixels (e.g., P of FIG. 12) may include 7 thin-film transistors TR1~TR7, a capacitor CST, and an organic light emitting diode OLED. The driver circuit illustrated in FIG. 13 may be used for improving a process deviation of the thin-film transistors TR1~TR7 and a response speed of a pixel, and can be changed or modified in various forms. The driver circuit illustrated in FIG. 13 is disclosed by Korea patent publication No. 10-2016-0024191, and thereby a detailed description of a driving method will be omitted here, which is incorporated herein by reference. The structure of a pixel or related driving circuitry is not limited to the example of FIG. 13, and may be changed or modified in various forms.

Figure 14:
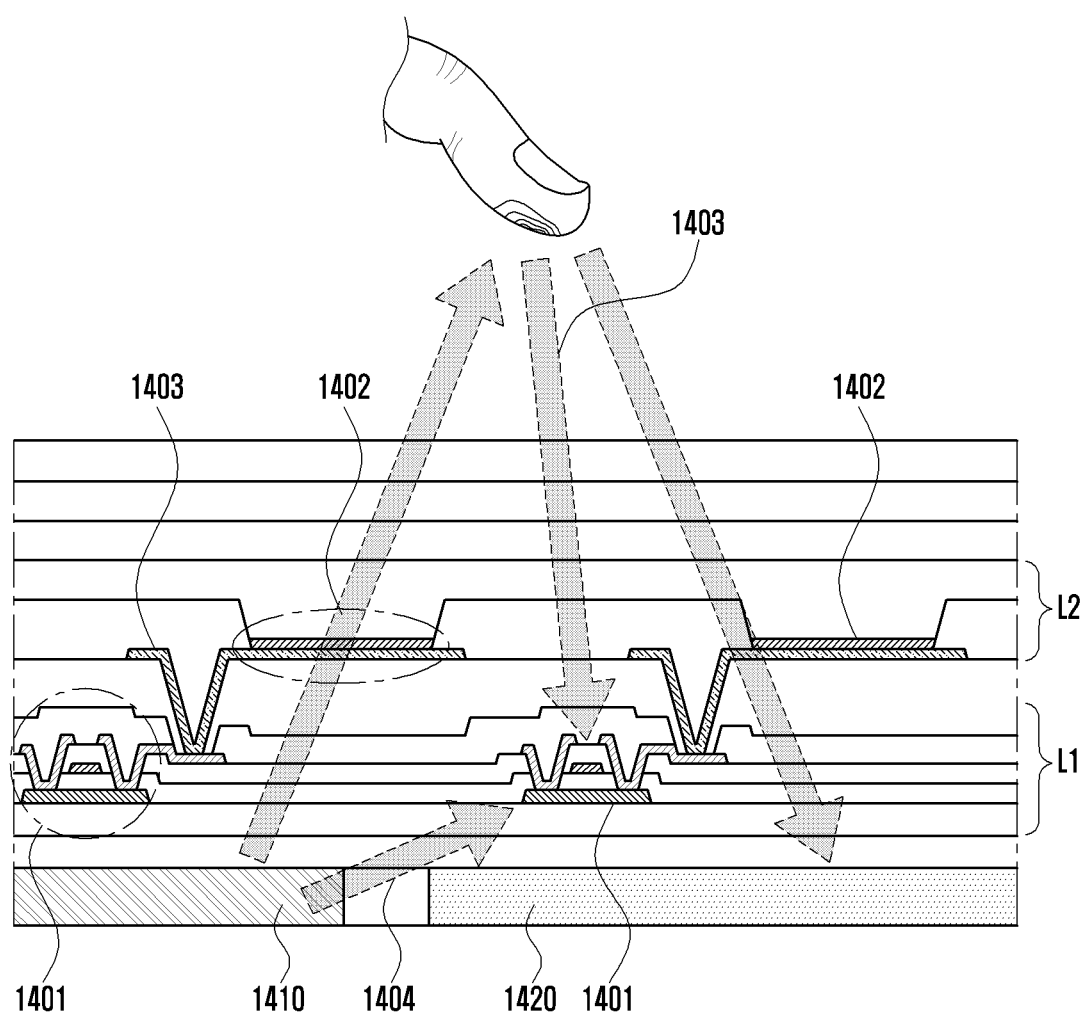
FIG. 14 is a cross sectional view illustrating a first area according to various example embodiments of the present disclosure.

FIG. 14 is a cross sectional view illustrating a first area according to various example embodiments of the present disclosure.

With reference to FIG. 14, a display may include a first layer L1 formed with at least one thin-film transistor (TFT) 1401 and a second layer L2 located at an upper part of the first layer L1 and formed with an organic light emitting diode (OLED) 1402.

The thin-film transistor 1401 and the organic light emitting diode 1402 can be connected each other through a transparent electrode 1403, made of a transparent conductive material such as ITO, fluorinated tin oxide, or the like. Fingerprint sensors 1410 and 1420 may include a light emitting circuitry 1410 and a light receiving circuitry 1420 located at a lower part of the first layer L1. The light emitting circuitry 1410 can emit light having a specific frequency band (e.g., infrared light). If the light emitted by the light emitting circuitry 1410 is reflected by a user's fingerprint (e.g., finger), the light receiving circuitry 1420 can identify the user's fingerprint by sensing the reflected light. However, some part 1404 of the light emitted by the light emitting circuitry 1410 and some part 1403 of the light reflected by the user's body can enter the thin-film transistor 1401, and the corresponding light can generate an unintentional leak current in/by the TFT. Various example embodiments of the present disclosure can form a structure for preventing/reducing at least one thin-film transistor 1401 from an inflow light. Hereinafter, a detailed description will follow.

Figure 15:
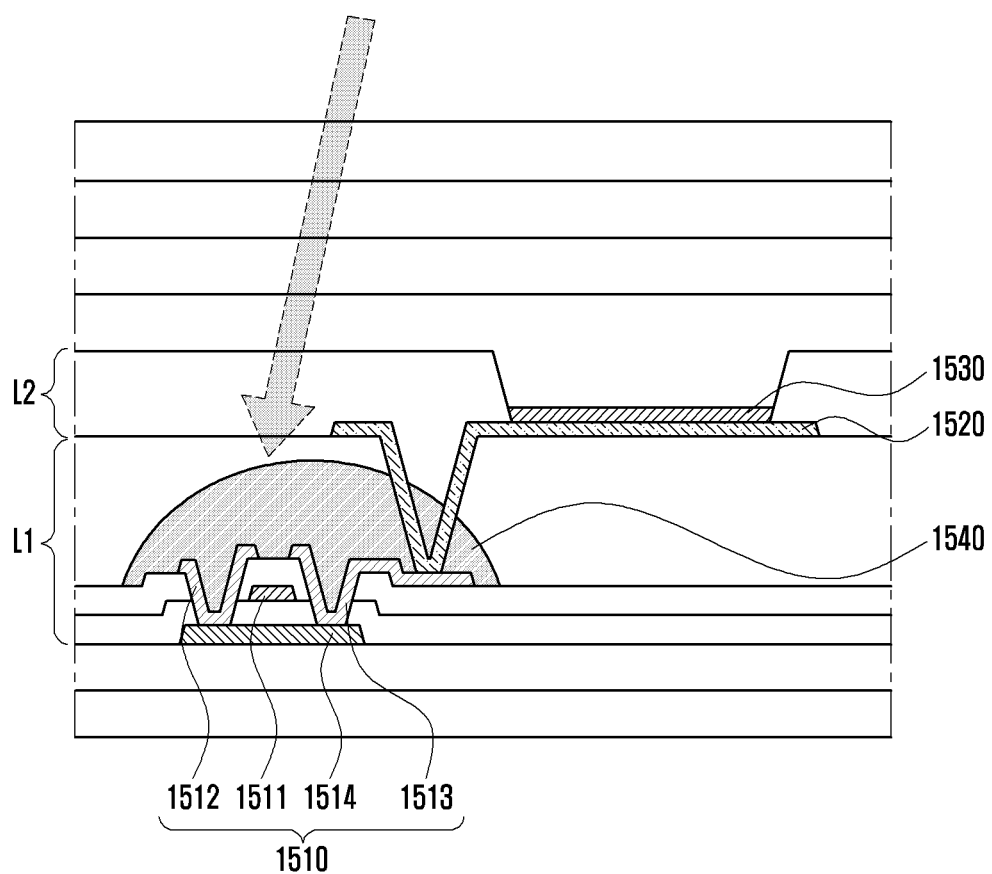
FIG. 15 is a cross sectional view illustrating at least one thin-film transistor according to an example embodiment of the present disclosure.

FIG. 15 is a cross sectional view illustrating at least one thin-film transistor according to an example embodiment of the present invention.

With reference to FIG. 15, the thin-film transistor 1510 may include a semiconductor layer 1514, conductive gate electrode 1511, conductive source electrode 1512, and conductive drain electrode 1513. For example, a buffer layer can be formed on a substrate of a display, and a semiconductor layer 1514 can be formed on the buffer layer. A first insulator film (e.g., silicon nitride) can be formed over the buffer layer including over the semiconductor layer 1514, and the gate electrode 1511 can be formed on the substrate and on the first insulator film by overlapping the semiconductor layer 1514. A second insulator film can be formed over the first insulator film including over the gate electrode 1511, and source electrode 1512 and drain electrode 1513 can be formed to connect with the semiconductor layer 1514 by piercing the first insulator film and the second insulator film as shown in FIG. 15. The source electrode 1512 and the drain electrode 1513 can be displaced across the gate electrode 1511. The drain electrode 1513 can be connected to an organic light emitting diode 1530 through a transparent conductive electrode 1520.

Although the thin-film transistor 1510 illustrated in FIG. 15 has a top gate structure of which the gate electrode 1511 is located at a relatively upper part of the semiconductor layer, the thin-film transistor 1510 according to various example embodiments of the present invention may instead have a bottom gate structure where the gate electrode 1511 is located below the semiconductor layer 1514. However, hereinafter the thin-film transistor 1510 will be described based on the top gate structure for purposes of example and ease of understanding.

According to an example embodiment, a light shielding material 1540 may be formed at the same layer of the thin-film transistor 1510, as shown in FIG. 15 for example. The light shielding material 1540 can be formed to cover at least a front/top surface of the thin-film transistor 1510. For example, the light shielding material 1540 can be formed to cover a part of a second insulator film and to cover part or all of source electrode 1512 and drain electrode 1513. The light shielding material 1540 may be configured with a material for absorbing and/or reflecting light output by the light emitting circuitry 1110. According to various example embodiments, the light shielding material 1540 can avoid a large leakage current by protecting a semiconductor layer 1514 from incident light output by the light emitting circuitry 1110.

In various example embodiments of the present disclosure, the light shielding material 1540 may be a material absorbing and/or reflecting an inflow light from the outside, including for absorbing and/or reflecting light(s) 1404 and/or 1403 of FIG. 14. For example, the light shielding material 1540 can be configured with a metal material for absorbing light, and/or the light shielding material 1540 can be configured with a material for reflecting light. The light shielding material 1540 may be a dielectric material in certain example embodiments.

Figure 16:
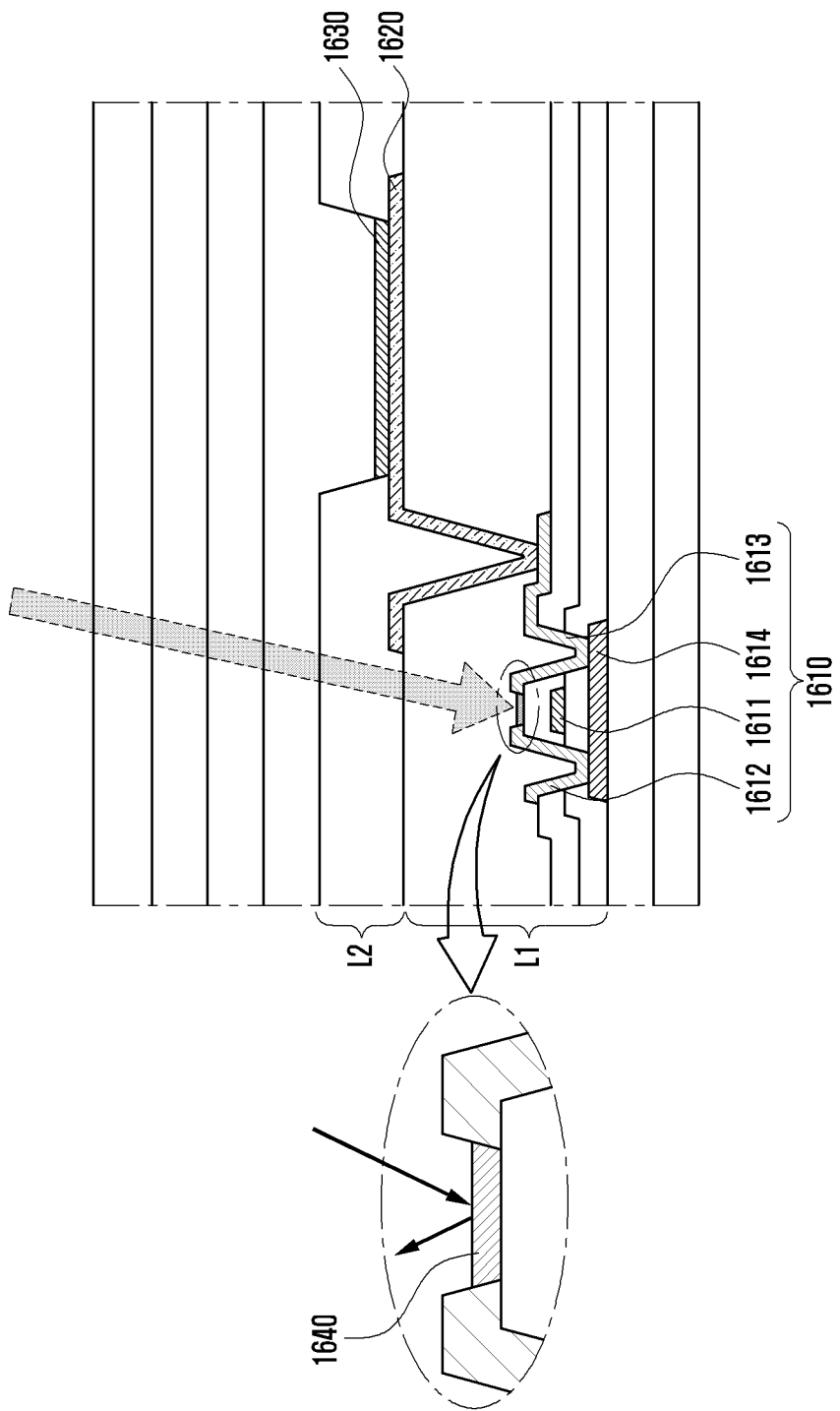
FIG. 16 is a cross sectional view illustrating at least one thin-film transistor according to another example embodiment of the present disclosure.

FIG. 16 is a cross sectional view illustrating at least one thin-film transistor according to another example embodiment of the present invention.

With reference to FIG. 16, the thin-film transistor 1610 may include a semiconductor layer 1614, gate electrode 1611, source electrode 1612, and drain electrode 1613. For example, an insulating buffer layer (e.g., of a dielectric material such as silicon nitride and/or silicon oxynitride) may be formed on a substrate of a display, and a semiconductor layer 1614 can be formed on (directly or indirectly) the buffer layer. A first insulator film (e.g., of a dielectric material such as silicon nitride and/or silicon oxynitride) can be formed on the substrate over the buffer layer and over the semiconductor layer 1614, and a gate electrode 1611 can be formed on the first insulator film at least by overlapping the semiconductor layer 1614. A second insulator film (e.g., of a dielectric material such as silicon nitride and/or silicon oxynitride) can be formed over the first insulator film and over the gate electrode 1611, and source electrode 1612 and drain electrode 1613 can be formed over the first and second insulator films so as to connect with the semiconductor layer 1614 by piercing the first insulator film and the second insulator film. The source electrode 1612 and the drain electrode 1613 can be displaced across the gate electrode 1611. The drain electrode 1613 can be connected with an organic light emitting diode 1630 through a transparent conductive electrode 1620.

Differently from FIG. 15, the thin-film transistor 1610 illustrated in FIG. 16 can be formed so that a light shielding material 1640 covers an upper part of the thin-film transistor 1610, but not necessarily other areas of the TFT. For example, the light shielding material 1640 can cover at least a channel portion of the TFT and/or a part of an upper part of the thin-film transistor 1610. For example, the light shielding material 1640 can be formed correspondingly between the source electrode 1612 and the drain electrode 1613 as shown in FIG. 16, so that the light shielding material 1640 together with the source and drain electrodes prevent or reducing the amount of incident light reaching the semiconductor material in the channel area of the TFT.

Figure 17:
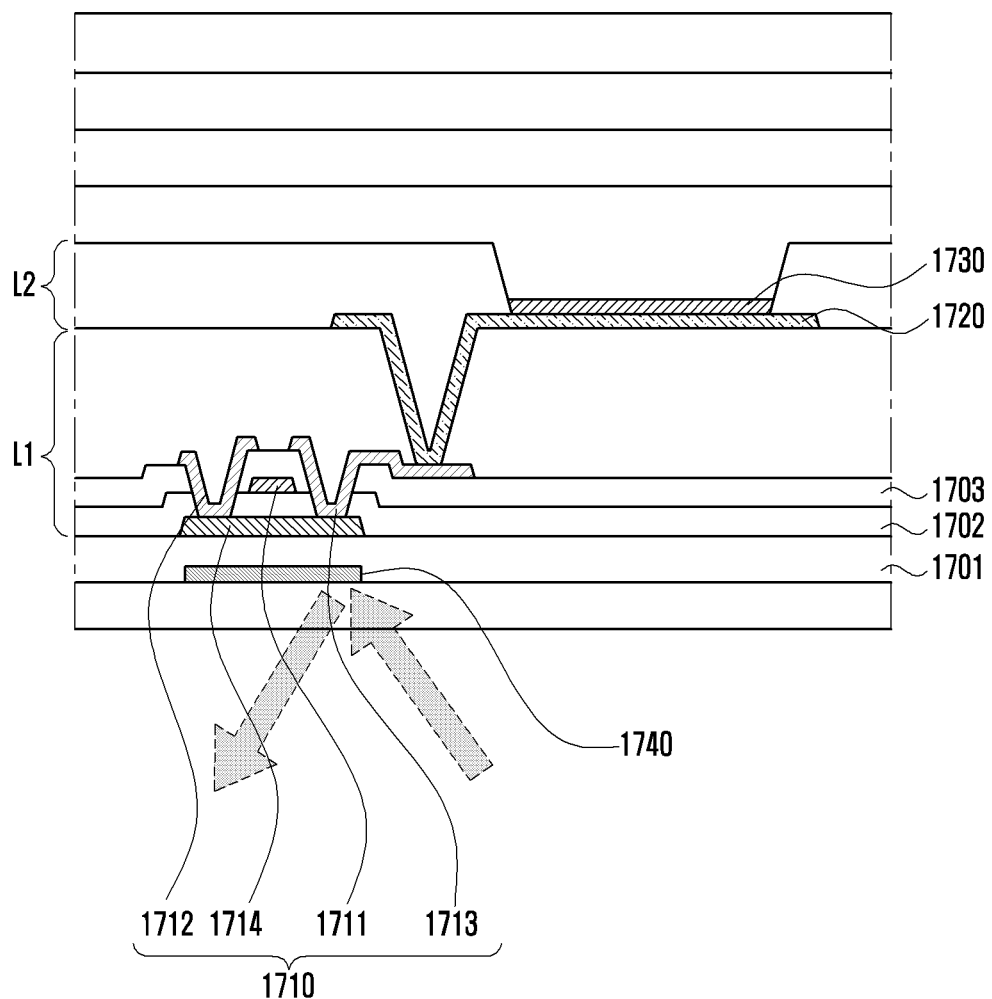
FIG. 17 is a cross sectional view illustrating at least one thin-film transistor according to a further other example embodiment of the present disclosure.

FIG. 17 is a cross sectional view illustrating at least one thin-film transistor according to a further other example embodiment of the present invention.

With reference to FIG. 17, the thin-film transistor 1710 may include a semiconductor layer 1714, gate electrode 1711, source electrode 1712, and drain electrode 1713. For example, a buffer layer 1701 can be formed on a substrate of a display, and a semiconductor layer 1714 can be formed on the buffer layer 1701. A first insulator film 1702 can be formed over the buffer layer and over the semiconductor layer 1714, and a gate electrode 1711 can be formed on the first insulator film 1702 by overlapping the semiconductor layer 1714. A second insulator film 1703 can be formed over the first insulator film 1702 and over the gate electrode 1711, and a source electrode 1712 and a drain electrode 1713 can be formed to electrically connect with the semiconductor layer 1714 by piercing the first insulator film 1702 and the second insulator film 1703 as shown in FIG. 17. The source electrode 1712 and the drain electrode 1713 can be displaced across the gate electrode 1711. The drain electrode 1713 can be connected with an organic light emitting diode 1730 through a transparent conductive electrode 1720.

Differently from FIG. 15, a light shielding material 1740 can be formed at a lower part of the thin-film transistor 1710 in FIG. 17 by overlapping at least part of the thin-film transistor 1710, and in particular by overlapping at least a channel portion of the TFT 1710 as viewed from below. For example, the light shielding material 1740 can be overlapped with a majority of or all of the semiconductor layer 1714 of the thin-film transistor 1710. According to an example embodiment, if the light shielding material 1740 is formed at the lower part of the thin-film transistor 1710, the light shielding material 1740 can be formed between the light emitting circuitry 1110 and the thin-film transistor 1710.

According to various embodiments embodiment, the light shielding material 1740 may be a metal connected to ground. By connecting the light shielding material 1740 to ground, various example embodiments of the present disclosure can prevent a malfunction of a thin-film transistor or a capacitor caused by an external signal or noise. For example, the light shielding material 1740 may be configured with a metal connected to ground, and accordingly can prevent or reduce deterioration of image quality by performing a shielding function. The shielding function may mean a function of preventing or reducing a malfunction of a thin-film transistor (i.e., leakage current) caused by an external noise or signal. Alternatively, the shielding function may mean a function of preventing or reducing a malfunction of a capacitor (i.e., unintentional capacitance change) caused by an external noise or signal.

Various example embodiments of the present disclosure can provide the light shielding material 1740 to absorb or reflect light, and additionally can prevent a malfunction of a thin-film transistor or an unintentional capacitance change caused by an external noise of signal.

According to various example embodiments of the present disclosure, a shielding effect of the light shielding material 1740 by connecting to the ground may be more useful in case of a flexible display. According to various example embodiments of the present disclosure, the display can be a flexible display. For example, the flexible display may be a curved display, bending display, rollable display, stretchable display, or cylindrical display disclosed by U.S. Pat. No. 8,665,236 B2 or No. 20160306476 A1.

According to various example embodiments of the present disclosure, because the light shielding material 1740 performs a shielding function by connecting to the ground, a metal film attached to a rear surface of a display panel for noise shielding in a conventional flexible display can be omitted. For example, the light shielding material 1740 replaces a metal film (e.g., copper film), and can prevent malfunctions of a thin-film transistor and a capacitor disposed in a display area, which are caused by noises of an alternative current (AC), wireless charging (WPC), or MST (e.g., Samsung Pay).

Figure 18:
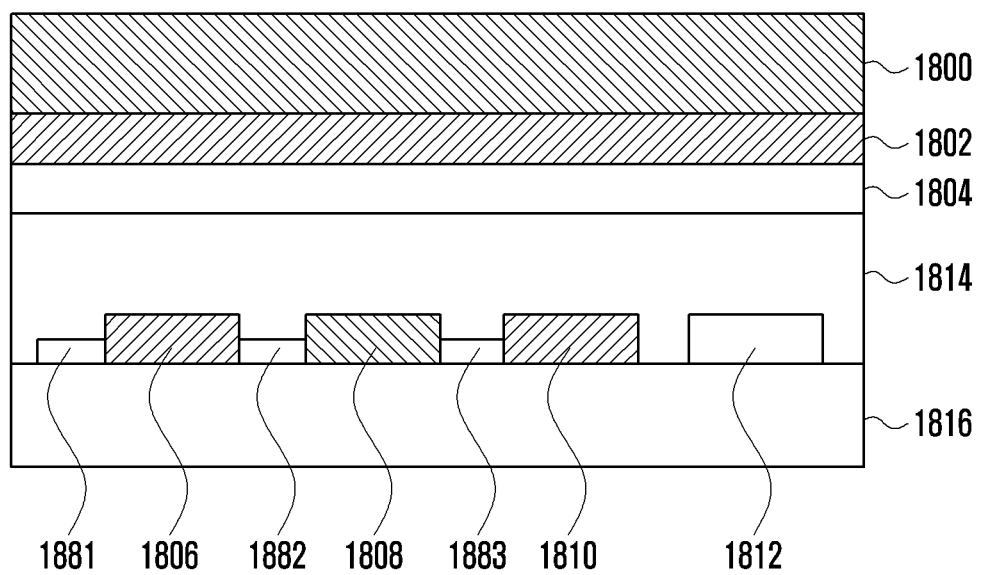
FIG. 18 is a cross sectional view illustrating a display having a structure of integrating an IR LED in a pixel according to various example embodiments of the present disclosure.

FIG. 18 is a cross sectional view illustrating a display having a structure of integrating an IR LED in a pixel according to various example embodiments of the present disclosure.

In FIG. 18, reference number 1800 indicates a windows glass, reference number 1802 indicates a touch screen, reference number 1804 indicates a polarizing layer, reference number 1814 indicates an OLED layer, reference number 1806 indicates a red OLED, reference number 1808 indicates a green OLED, reference number 1810 indicates a blue OLED, reference number 1812 indicates an IR OLED, and reference number 1816 indicates a substrate including a TFT.

With reference to FIG. 18, the IR OLED 1812 may be located on the same layer of the red OLED 1806, green OLED 1808, and blue OLED 1810. According to an embodiment, in order to prevent a light leakage, light shielding materials 1881, 1882, and 1883 may be located at the boundaries of the red OLED 1806, green OLED 1808, and blue OLED 1810. Alternatively, the light shielding materials 1881, 1882, and 1883 may be located not only at the boundaries of the red OLED 1806, green OLED 1808, and blue OLED 1810) but also at upper parts of the red OLED 1806, green OLED 1808, and blue OLED 1810. Generally, the penetration rate of infrared light generated by the IR OLED 1812 is very low as about 4%. Accordingly, various example embodiments of the present disclosure can install the IR OLED 1812 at an upper part of an OLED layer 1814 in order to increase light efficiency. According to an embodiment of the present invention, the electronic device may include a separate IR driver circuit for controlling a drive of the IR OLED 1812 because the IR OLED 1812 must be driven separately from the OLEDs 1806, 1808, and 1810. The IR driver circuit according to an embodiment of the present invention can be configured together with an LTPS TFT layer 1816 for driving the OLEDs 1806, 1808, and 1810, and an IC for controlling them can be configured separately.

Figure 19:
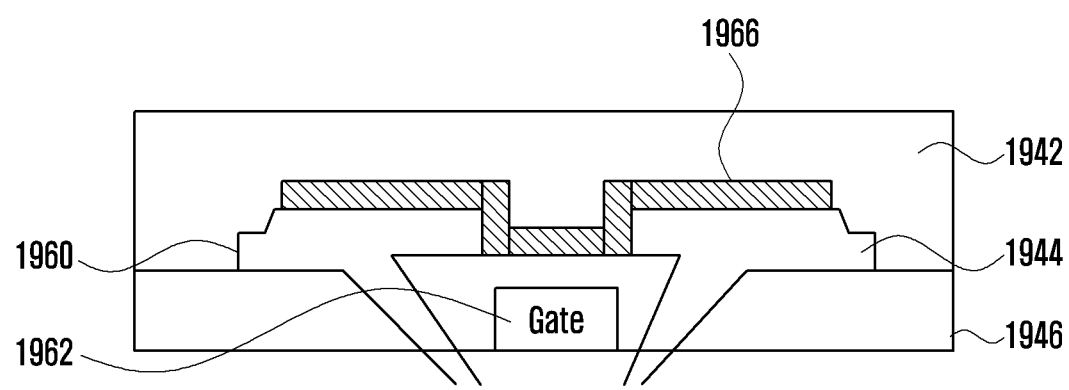
FIG. 19 illustrates a structure of a light shielding material covering a source electrode and a drain electrode of a thin-film transistor.

FIG. 19 illustrates a structure of a light shielding material covering a source electrode and a drain electrode of a thin-film transistor.

With reference to FIG. 19, the thin-film transistor may include a gate electrode 1962 formed on a substrate 1946, a gate insulator film 1946 covering the gate electrode 1962, a source electrode 1960 and a drain electrode 1944 disposed parallel across the gate electrode 1962 on the gate insulator film 1946 and an insulation layer 1942 formed at a front surface of the substrate 1946 including the source electrode 1960 and the drain electrode 1944.

According to an embodiment of the present invention, the light shielding material 1966 can be formed to cover upper parts of the source electrode 1960 and the drain electrode 1944 as shown in FIG. 19. According to an embodiment of the present invention, the light shielding material can be formed exclusively only for the area where the infrared light enters relatively much.

As described above, various example embodiments of the present disclosure can satisfy user's needs with a larger screen area (display area) by disposing a biometric sensor corresponding to the screen area of a display. Further, various example embodiments of the present disclosure can prevent a leakage current and a light leakage phenomenon generated while driving an optical biometric sensor by forming a light shielding material in at least one thin-film transistor.

An electronic device according to various example embodiments of the present disclosure can improve usability by using biometric sensor synchronized with a display.

A programming module according to embodiments of the present disclosure may include one or more of the aforementioned components or may further include other additional components, or some of the aforementioned components may be omitted. Operations executed by a module, a programming module, or other component elements according to various embodiments of the present disclosure may be executed sequentially, in parallel, repeatedly, or in a heuristic manner. Further, some operations may be executed according to another order or may be omitted, or other operations may be added.

While the disclosure has been illustrated and described with reference to certain embodiments thereof, it will be understood by those skilled in the art that various changes in form and detail may be made therein without departing from the spirit and scope of the disclosure as defined by the appended claims.

What is claimed is:

1. An electronic device comprising:
a sensor, disposed below a display panel, including a light emitting circuitry configured to output infrared light and a light receiving circuitry configured to sense infrared light reflected by a user among the output infrared light; and
the display panel configured to display an image by using one or more pixels,
wherein the one or more pixels include:
a plurality of organic light emitting diodes (OLED);
at least one driver circuit comprising a plurality of thin-film transistors and formed below the plurality of organic light emitting diodes and configured to drive the plurality of organic light emitting diodes; and
a light shielding material formed to shield at least part of the plurality of thin-film transistors in order to protect from the infrared light from the light emitting circuitry,
wherein the at least one driver circuit that is protected by the light shielding material from the infrared light is in the vicinity of the light emitting circuitry,
wherein the light shielding material comprises a material for absorbing and/or reflecting infrared light outputted from the light emitting circuitry, and
wherein at least one of the plurality of thin-film transistors comprises a semiconductor layer, a gate electrode, a source electrode, a drain electrode and at least one capacitor.

2. The electronic device of claim 1, wherein the light shielding material is formed to cover at least part of the at least one thin-film transistor.

3. The electronic device of claim 2, wherein the light shielding material is formed to cover an entire upper part of the at least one thin-film transistor.

4. The electronic device of claim 2, wherein the light shielding material is formed to cover a space between the source electrode and the drain electrode.

5. The electronic device of claim 1, wherein the light shielding material is formed at a lower part of the at least one thin-film transistor so as to be located between at least the thin film transistor and a substrate supporting the thin film transistor.

6. The electronic device of claim 1, wherein the light shielding material is connected to ground.

7. An electronic device comprising:
a display;
a biometric sensor disposed in at least one part of the display and comprising a light emitting circuitry for outputting infrared light for obtaining biometric information of a user and a light receiving circuitry for sensing infrared light; and a processor configured to control the display and the biometric sensor,
wherein the display comprises:
at least one thin-film transistor configured to drive at least one pixel of the display, and
a light shielding material is formed on the same or a different layer as/from the at least one thin-film transistor in the display,
wherein the light shielding material comprises a material for absorbing and/or reflecting the infrared light output by the light emitting circuitry, and
wherein the at least one thin-film transistor that is protected by the light shielding material from the infrared light is in the vicinity of the light emitting circuitry.

8. The electronic device of claim 7, wherein the at least one thin-film transistor comprises:
a semiconductor layer;
a gate electrode formed on a first insulator film so as to be over and overlapping the semiconductor layer; and
a source electrode and a drain electrode formed on a second insulator film over the gate electrode,
wherein the drain electrode is connected electrically to an organic light emitting diode.

9. The electronic device of claim 8, wherein the light shielding material is formed on the same layer as the at least one thin-film transistor.

10. The electronic device of claim 9, wherein the light shielding material covers a front surface of the at least one thin-film transistor.

11. The electronic device of claim 10, wherein the light shielding material is formed to cover a part of the second insulator film and at least part of the source electrode and at least part of the drain electrode.

12. The electronic device of claim 10, wherein the light shielding material is formed to cover an upper part of the at least one thin-film transistor corresponding to a space between the source electrode and the drain electrode.

13. The electronic device of claim 10, wherein the light shielding material is formed to cover the source electrode, the drain electrode, and at least part of a second insulator film between the source electrode and the drain electrode.

14. The electronic device of claim 7, wherein the light emitting circuitry is disposed at a lower part of the at least one thin-film transistor.

15. The electronic device of claim 7, wherein the light shielding material is formed between the light emitting circuitry and the at least one thin-film transistor.

16. The electronic device of claim 7, wherein the display comprises:
a first layer formed with the at least one thin-film transistor; and
a second layer formed with an organic light emitting diode on an upper part of the first layer,
wherein the biometric sensor comprises a light emitting circuitry and a light receiving circuitry located on the same or a different layer as/from the first layer and the second layer.

* * * * *